(12) United States Patent
Guionnet et al.

(10) Patent No.: US 7,215,265 B2
(45) Date of Patent: May 8, 2007

(54) DEVICE AND METHOD FOR ROBUST DECODING OF ARITHMETIC CODES

(75) Inventors: Thomas Guionnet, Rennes (FR); Christine Guillemot, Chantepie (FR)

(73) Assignee: INRIA Institut National de Recherche en Informatique et en Automatique, Le Chesnay Cedex (FR)

( * ) Notice: Subject to any disclaimer, the term of this patent is extended or adjusted under 35 U.S.C. 154(b) by 0 days.

(21) Appl. No.: 10/521,962

(22) PCT Filed: Jul. 16, 2003

(86) PCT No.: PCT/FR03/02246

§ 371 (c)(1),
(2), (4) Date: Aug. 9, 2005

(87) PCT Pub. No.: WO2004/012340

PCT Pub. Date: Feb. 5, 2004

(65) Prior Publication Data

US 2006/0106901 A1    May 18, 2006

(30) Foreign Application Priority Data

Jul. 22, 2002  (FR) .................................. 02 9287
Mar. 18, 2003 (FR) .................................. 03 3288

(51) Int. Cl.
*H03M 7/00*   (2006.01)

(52) U.S. Cl. .............................................. 341/107; 341/67

(58) Field of Classification Search ................ 341/107, 341/67; 375/240.2; 348/441, 385, 581; 382/239, 263, 299
See application file for complete search history.

(56) References Cited

U.S. PATENT DOCUMENTS 5,650,783 A * 7/1997 Murashita et al. .......... 341/107

(Continued)

OTHER PUBLICATIONS

Murad, A. H., et al., "Joint Source-Channel Decoding of Variable-Length Encoded Sources", XP-002143123, pp. 94-95 (1998), no month.

(Continued)

*Primary Examiner*—Rexford Barnie
*Assistant Examiner*—Joseph Lauture
(74) *Attorney, Agent, or Firm*—Foley & Lardner LLP

(57) ABSTRACT

The invention concerns a decoder (2) comprising a first input for receiving a coded flow of second binary elements (Yd). It comprises a second input for receiving channel properties (Ic) designed to define probabilities of receiving second binary elements, upon transmitting first binary elements, a first module (12) defining a source model (8) adapted to define the probabilities for x-ray symbols associated with transitions between source states in a source state diagram, a so-called product model (7), adapted to define a correspondence between the x-ary symbols and the first binary elements produced in a product state diagram, a product state being a function of a source state, a processing module (6) adapted to calculate probabilities of decoding x-ary symbols, knowing bits of the coded flow of second binary elements from the channel properties (Ic) of the source model (8) and of the product model (7), and adapted to reconstitute the most probable flow of x-ary symbols from said computed probabilities.

20 Claims, 10 Drawing Sheets

Figure 1:
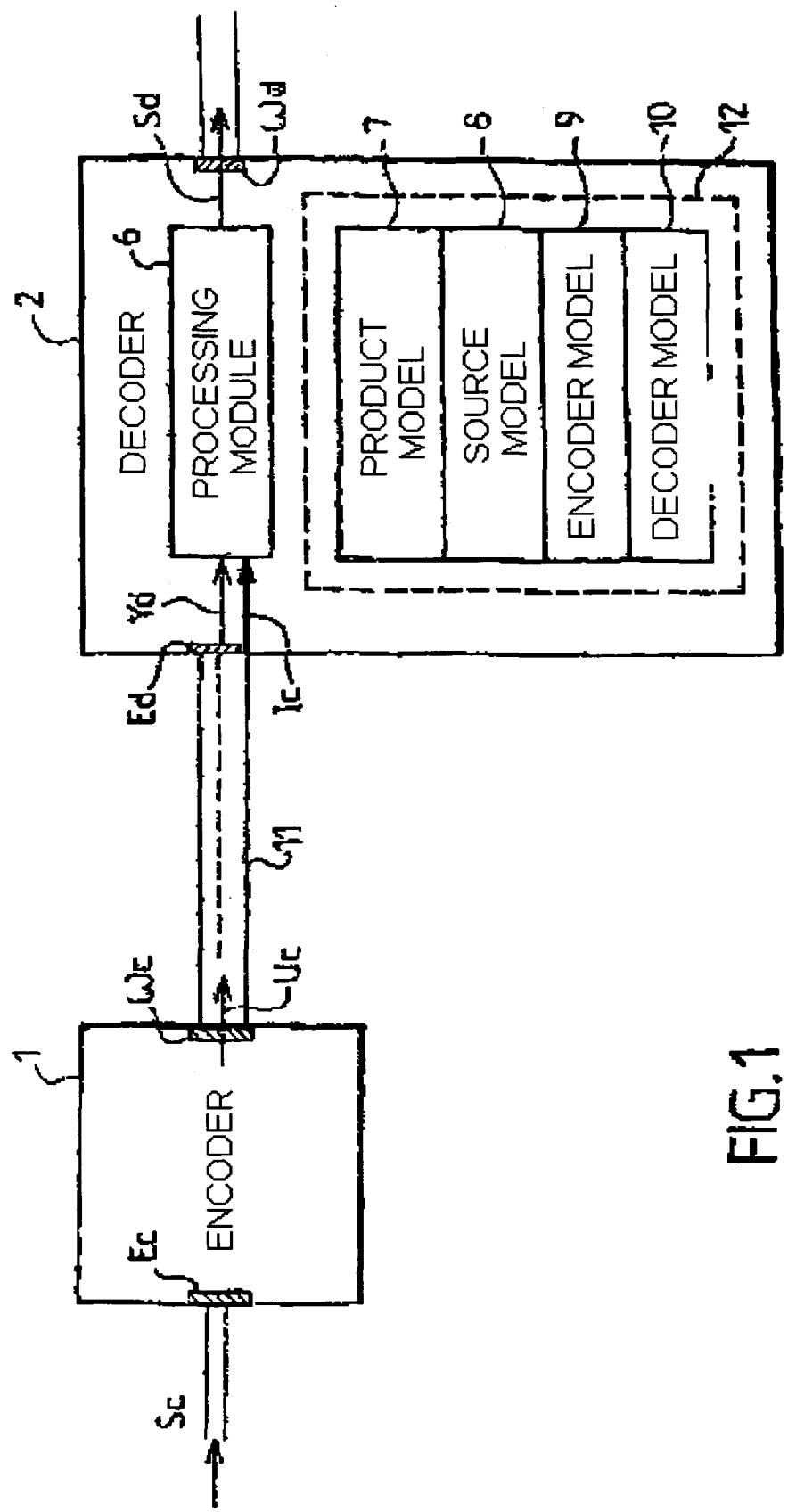

U.S. PATENT DOCUMENTS 6,128,412 A * 10/2000 Satoh ........................ 382/246
6,542,644 B1 * 4/2003 Satoh ........................ 382/246

OTHER PUBLICATIONS

Murad, A. H., et al., "Robust Transmission of Variable-Length Encoded Sources", pp. 968-972 (1999), no month.

Guyader, A., et al.,. "Joint Source-Channel Turbo Decoding of Entropy-Coded Sources", IEEE Journal on Selected Areas in Communications, vol. 19, No. 9, pp. 1680-1696 (2001), no month.

Demir, N., et al., "Joint Source/Channel Coding for Variable Length Codes", IEEE, pp. 139-148 (1998), no month.

Fabre, E., et al., "Joint Source-Channel Turbo Decoding of VLC-Coded Markov Sources", IEEE, pp. 2657-2660 (2001), no month.

Park, M., et al., "Decoding Entropy-Coded Symbols Over Noisy Channels by MAP Sequence Estimation for Asynchronous HMMs", IEEE, pp. 477-482 (1998), no month.

* cited by examiner

Table 1

| State $E_k$ | [low$S_k$, up$S_k$[ | P(0), corresponding subdivision interval | normal states model $S_k=0$ bits emitted | $S_k=0$ next state | $S_k=1$ bits emitted | $S_k=1$ next state | simplified states model $S_k=MPS$ bits emitted | $S_k=MPS$ next state | $S_k=LPS$ bits emitted | $S_k=LPS$ next state |
|---|---|---|---|---|---|---|---|---|---|---|
| 0 | [0,4[ | 0,63 ≤ P(0) | - | 1 | 11 | 0 | - | 1 | 11 | 0 |
|  |  | 0,37 ≤ P(0) < 0,63 | 0 | 0 | 1 | 2 | 0 | 0 | 1 | 0 |
|  |  | P(0) < 0,37 | 00 | 0 | - | - | 00 | 0 | 10 | 0 |
| 1 | 0,3 | 0,5 ≤ P(0) | 0 | 0 | 10 | 0 | 0 | 0 | 10 | 0 |
|  |  | P(0) < 0,5 | 011 | 0 | 11 | 0 | 011 | 0 | 11 | 0 |
| 2 | [1,4[ | 0,5 ≤ P(0) | 1,31 | 0 | 1 | 0 | | | | |
|  |  | P(0) < 0,5 | 1,2 | 1 | | | | | | |

Table 2

| State $E_n$ | State variables | P(MPS) (corresponding subdivision of [low Skn, upSkn[) | $U_n=0$ symbols emitted | $U_n=0$ next state | $U_n=1$ symbols emitted | $U_n=1$ next state |
|---|---|---|---|---|---|---|
| 0 | [lowU$_n$, upU$_n$[ : [0,4[ [lowS$_{kn}$, upS$_{kn}$[ : [0,4[ | 0,63 ≤ P(MPS) | MPS,MPS | 0 | - | 1 |
|  |  | 0,37 < P(MPS) < 0,63 | MPS | 0 | LPS | 0 |
| 1 | [lowU$_n$, upU$_n$[ : [2,4[ [lowS$_{kn}$, upS$_{kn}$[ : [0,4[ | 0,63 ≤ P(MPS) | MPS,LPS | 0 | LPS | 0 |

| State $X_k$ | State variables | MPS | LPS |
|---|---|---|---|
| 0 Initial state | {0,4[ C=0 | bits emitted: 0 next state: 1 | bits emitted: 1 next state: 2 |
| 1 | {0,4[ C=1 | bits emitted: - next state: 3 | bits emitted: 11 next state: 0 |
| 2 | [0,4[ C=2 | bits emitted: - next state: 3 | bits emitted: 11 next state: 0 |
| 3 | [0,3[ C=0 | bits emitted: 0 next state: 1 | bits emitted: 0 next state: 2 |
FIG. 6A
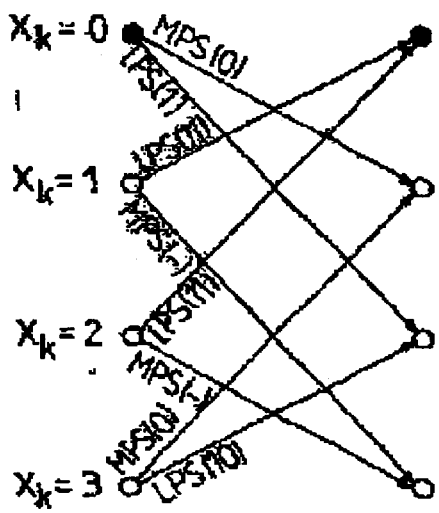
FIG. 6B
FIG. 7A          FIG. 7B

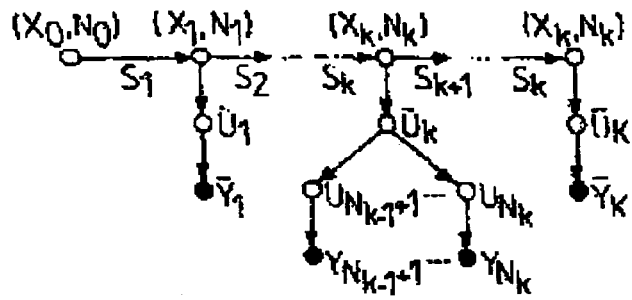

FIG.8

| State $X_k$ | State variables | $U_n = 0$ | $U_n = 1$ |
|---|---|---|---|
| 0 Initial state | [0,4[ [0,4[ C=0 | symbol emitted : MPS next state : 1 | symbol emitted:LPS next state : 2 |
| 1 | [0,4[ [0,4[ C=1 | symb emitted:MPS,MPS next state : 1 | symbol emitted: - next state : 3 |
| 2 | [0,4[ [0,4[ C=2 | symb emitted:MPS,MPS next state : 1 | symbol emitted: - next state : 4 |
| 3 | [2,4[ [0,4[ C=1 | symb emitted:MPS,LPS next state : 2 | symbol emitted: LPS next state : 0 |
| 4 | [2,4[ [0,4[ C=2 | symb emitted:MPS,LPS next state : 2 | symbol emitted: LPS next state : 0 |

FIG.9a

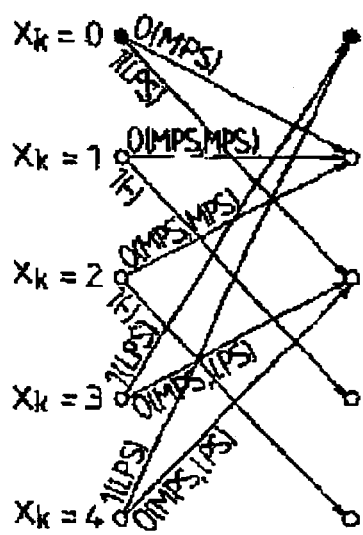

FIG.9b

DEVICE AND METHOD FOR ROBUST DECODING OF ARITHMETIC CODES

The invention relates to digital data compression/decompression, in particular for multimedia signals (audio, image, video, voice), and the robust transmission of this data on noisy networks, such as wireless and mobile communications networks.

To reduce the transmission rate of digital data, it is compressed, seeking at the same time to achieve the theoretical maximum that specialists refer to as "signal entropy". To do this, use is often made of statistical codes also termed variable length codes, for example Huffman codes. However, these codes have the drawback of being highly sensitive to transmission errors. Inversion of a bit can lead to desynchronisation of the decoder, which results in erroneous decoding of all the data following the position of the erroneous bit.

Existing solutions for the compression, transmission and decompression of multimedia signals over a network, to which further reference will be made, are based on the hypothesis that a certain quality of data transport service is guaranteed. In other words they assume that, by relying on the use of correction codes, the transport and link layers will make it possible to achieve a quasi-null residual error rate (i.e. as seen by the compression and decompression application). But this hypothesis of quasi-null residual error rate no longer holds true when the channel characteristics vary over time (non-stationary channels), in particular in wireless and mobile networks, and for a realistic complexity of the channel code. Furthermore, the addition of redundancy by correction codes leads to a reduction of the effective rate.

There is therefore a need for new encoding/decoding solutions.

The present invention proposes some advances in this area.

The invention relates to a decoding method including the following steps:

a. define a source model designed to define probabilities for x-ary symbols associated with transitions between source states in a source state diagram, a so-called "product" model designed to define a correspondence between the x-ary symbols and first binary elements in relation to product states in a "product" state diagram, a product state being a function of a source state, b. receive "channel" properties designed to define probabilities of receiving second binary elements, upon transmission of first binary elements, c. for a received coded flow of second binary elements, calculate the probabilities of decoding x-ary symbols, knowing bits of the -flow of second binary elements, and respectively the probabilities of arriving at product states knowing bits of the flow of second binary elements, from the channel properties of the source model and of the product model, d. reconstitute the most probable flow of x-ary symbols from the probabilities computed at step c.

Advantageously, the product model is defined on the basis of the source model and a transfer model designed to establish a correspondence between x-ary symbols and first binary elements in relation to probabilities associated with x-ary symbols. The source model includes transitions associated with a correspondence between source m-ary symbols and target x-ary symbols, in particular $m \geq x$ and $x=2$.

Preferably, the product and transfer models are of the arithmetic type and the transfer model is an encoding or decoding model.

More precisely, step c. includes the stepwise computation of the probabilities of decoding an x-ary symbol knowing bits of the flow of second binary elements.

In a first embodiment of the invention, step c. includes, for each step from a given number of steps and based on a given selection criterion, the selection of certain probabilities among the probabilities of decoding an x-ary symbol computed during a step, knowing bits of the flow of second binary elements.

Advantageously, the selection criterion at step c. includes a fixed number of probabilities to be retained among the highest probabilities. Alternatively or additionally, the selection criterion at step c. includes a minimum threshold compared to the probabilities of receiving second binary elements, upon transmitting first binary elements, so as to store at each step only the probabilities of decoding an x-ary symbol, knowing bits of the flow of second binary elements, computed from the probabilities of receiving second binary elements, upon transmitting first binary elements, higher than this minimum threshold.

Preferably, step c. includes the construction of a tree composed of states linked by transitions, each state corresponding to a step in the calculation of probabilities and each transition, starting from a state, corresponding to one of these computed probabilities. Thus, the selection of certain probabilities among the probabilities of decoding an x-ary symbol, knowing bits of the flow of second binary elements, corresponds to the construction of states corresponding to a subset of transitions in the tree as a function of said certain probabilities.

In addition, step d. includes computation of the product of the probabilities corresponding to successive transitions in the tree and selection of the largest product corresponding to the most probable successive transitions and the most probable flow of x-ary symbols.

In a first option, step c. includes the computation, for a given number of successive x-ray symbols to be decoded, of probabilities of decoding a sequence of x-ary symbols knowing bits of the flow of second binary elements.

In a second option, step c. includes the computation, for a given number of successive bits in the flow of second binary elements, of probabilities of decoding a sequence of x-ary symbols knowing bits of the flow of second binary elements.

In a second embodiment of the invention, based on the product model establishing said correspondence, step c. includes c1. successive construction of states linked by transitions in a product states diagram from an initial state to a final state, each state defining an expected number of decoded x-ary symbols for a given number of bits in the flow of second binary elements from the initial state.

Advantageously, the construction of step c. includes c2. successive suppression of states from the product states diagram, from the final state to the initial state, for which the expected number of x-ary symbols for a given number of bits in the flow of second binary elements is different from a known maximum number of x-ary symbols.

In a first option, step c. includes c1. computation, after constructing each state, of the first successive probabilities of arriving at a given state knowing past bits of the flow of second binary elements, c2. computation, for each state from the final state to the initial state, of second successive probabilities of arriving at this given state knowing next bits in the flow of second binary elements.

In a second option, step c. includes c3. computation, for each state of the diagram from the initial state to the final state, of first successive probabilities of-arriving at this state knowing past bits in the flow of second binary elements and, for each state from the final state to the initial state, of second successive probabilities of arriving at a given state knowing next bits in the flow of second binary elements.

Preferably, step c. includes computation of the probability of each state by determining the product of the first and second probabilities for each state and, step d. includes computation of the products of probabilities of possible different successive states followed by selection of the maximum product.

Advantageously, step d. includes establishment of the flow of x-ary symbols corresponding to these successive states using the correspondence of the product model.

The invention also relates to a decoder including a first input to receive an encoded flow of second binary elements. This decoder includes a second input to receive channel properties designed to define probabilities of receiving second binary elements, upon transmitting first binary elements, a first module defining a source model designed to define probabilities for x-ary symbols associated with transitions between source states in a source state diagram, a so-called "product" model designed to define a correspondence between the x-ary symbols and first binary elements in relation to product states in a "product" state diagram, a product state being a function of a source state, a processing module adapted to calculate probabilities of decoding x-ary symbols, knowing bits of the coded flow of second binary elements, respectively the probabilities of arriving at product states knowing bits of the flow of second binary elements, from the channel properties, of the source model and of the product model, and adapted to reconstitute the most probable flow of x-ary symbols from said computed probabilities.

Figure 2:
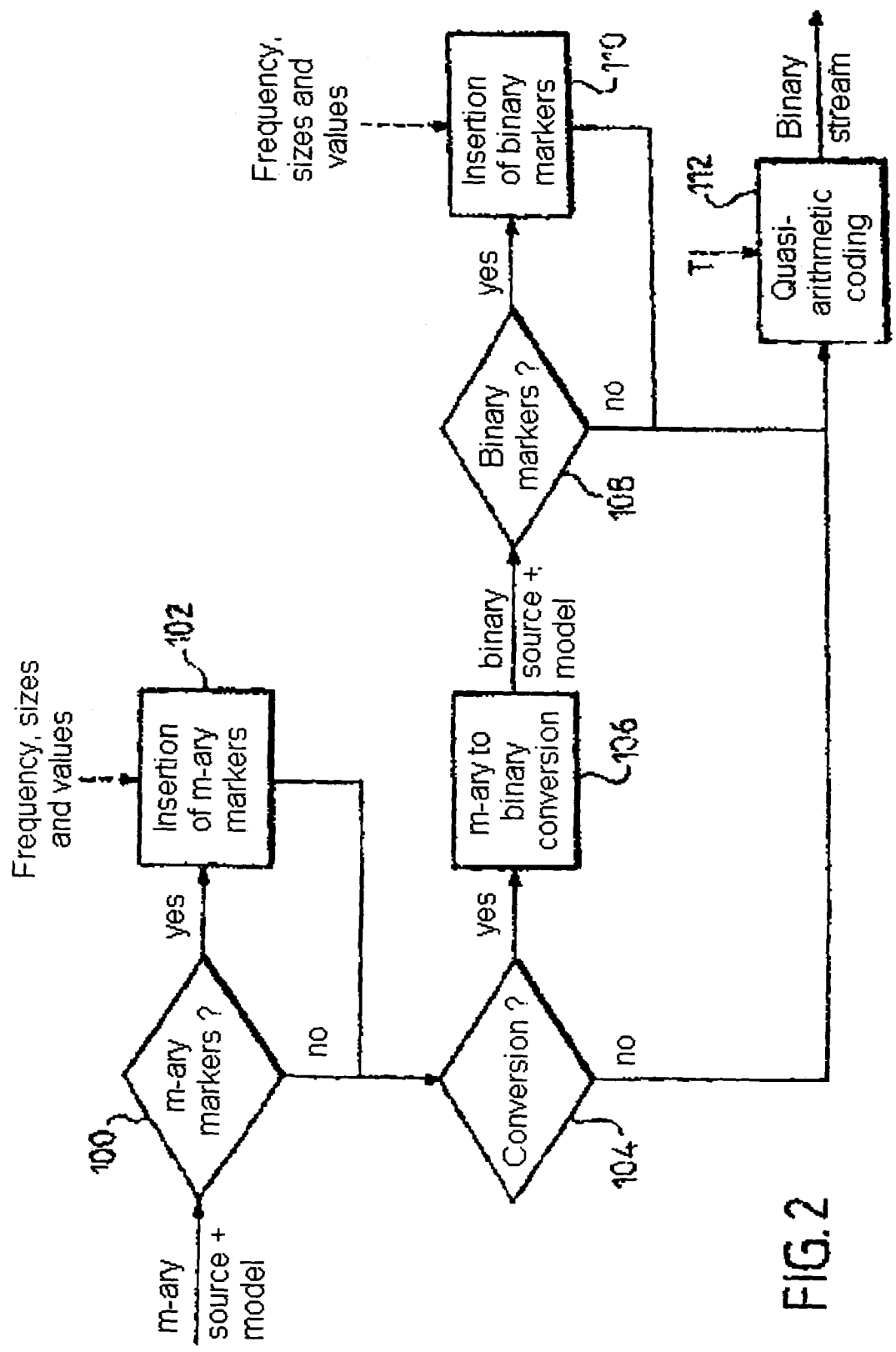
Figure 3:
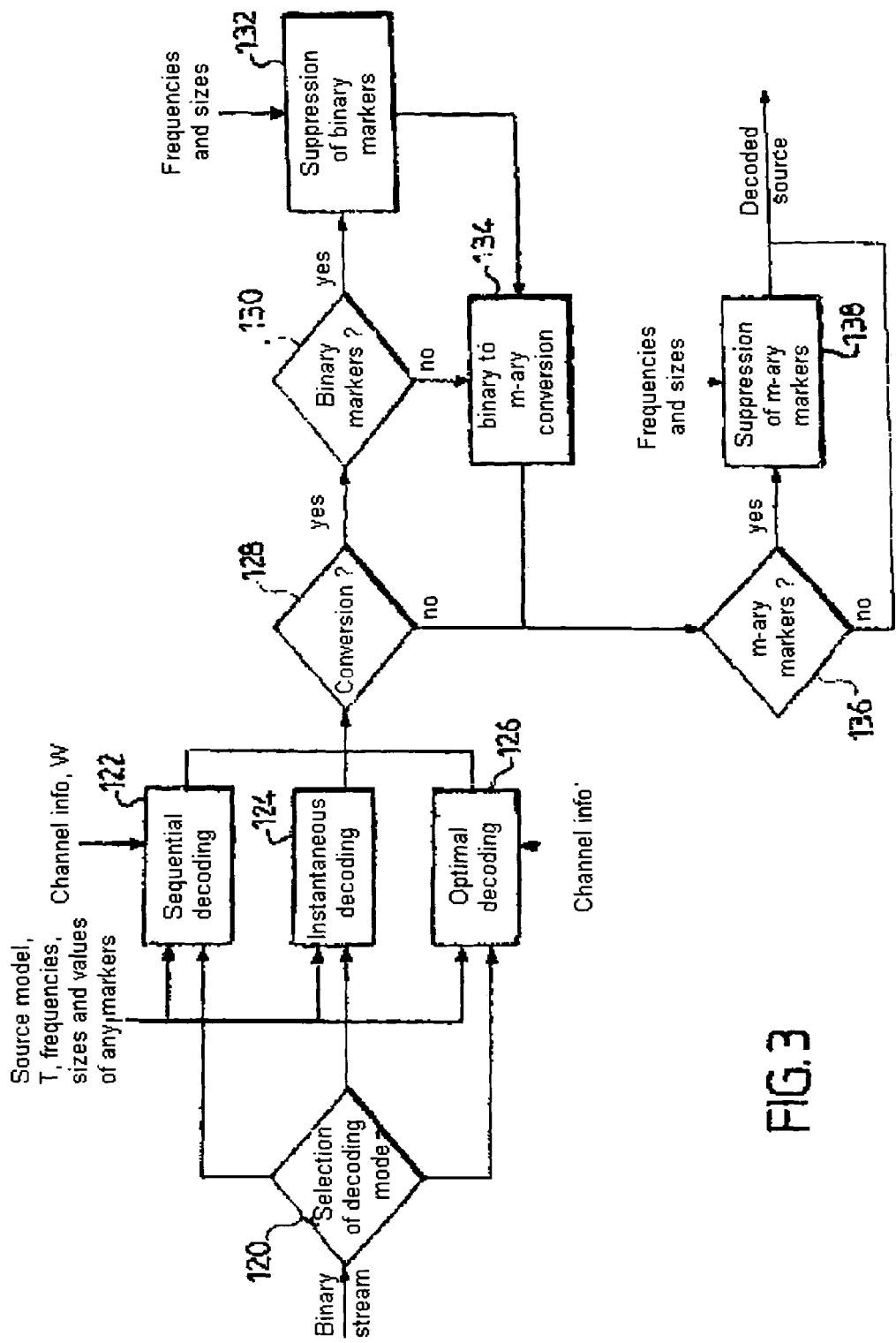
Figure 4A:
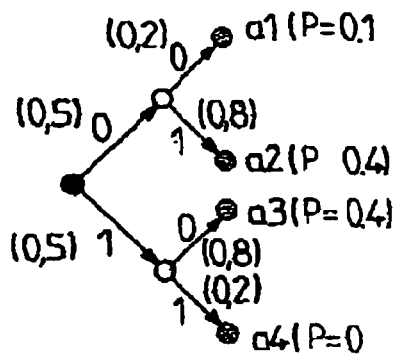
Figure 4B:
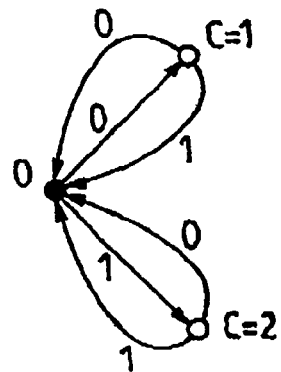
Figure 4C:
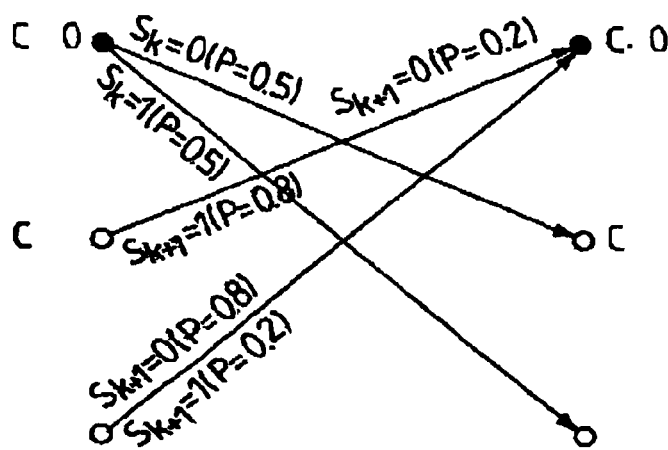
Figure 5A:
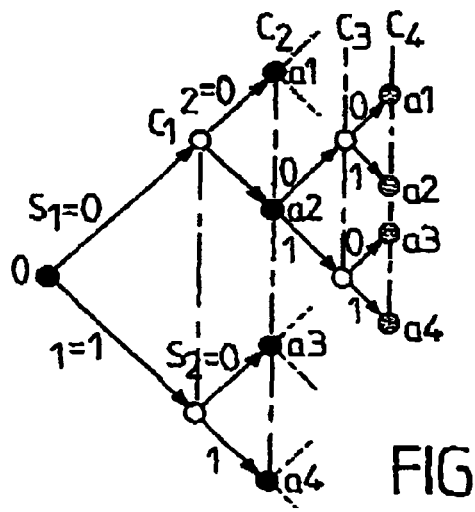
Figure 5B:
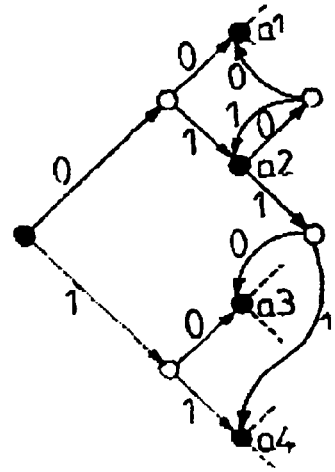
Figure 10:
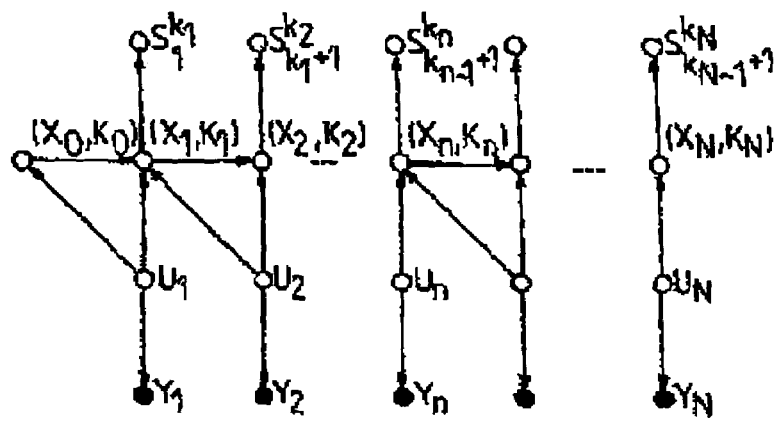
Figure 11:
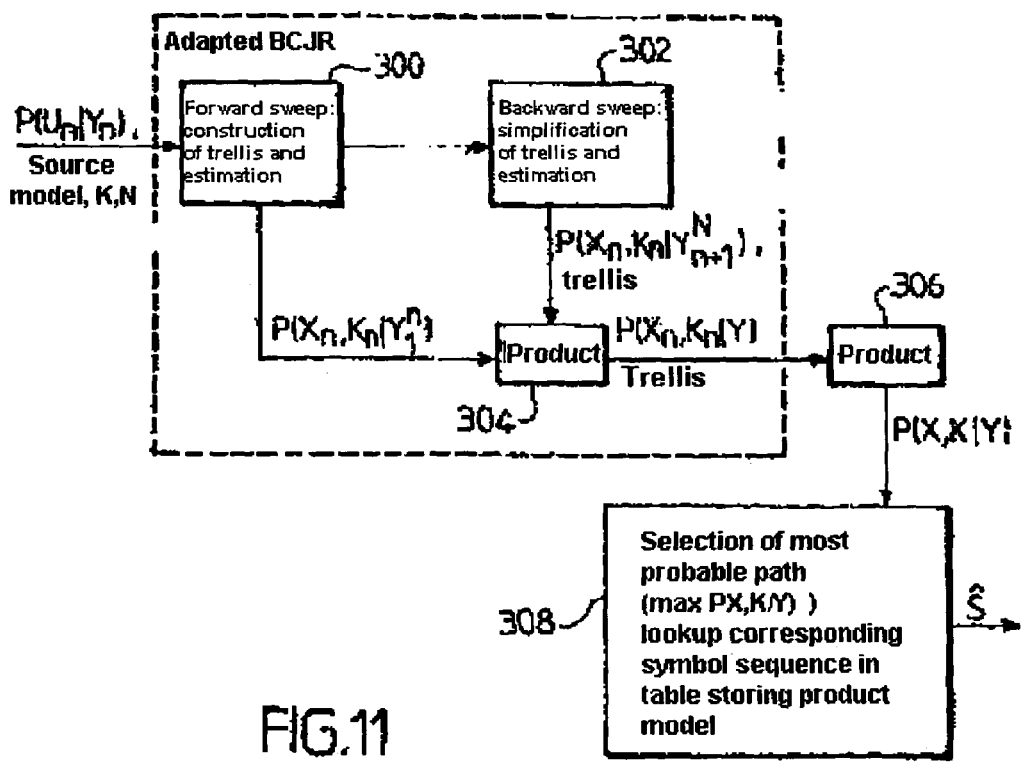
Figure 12:
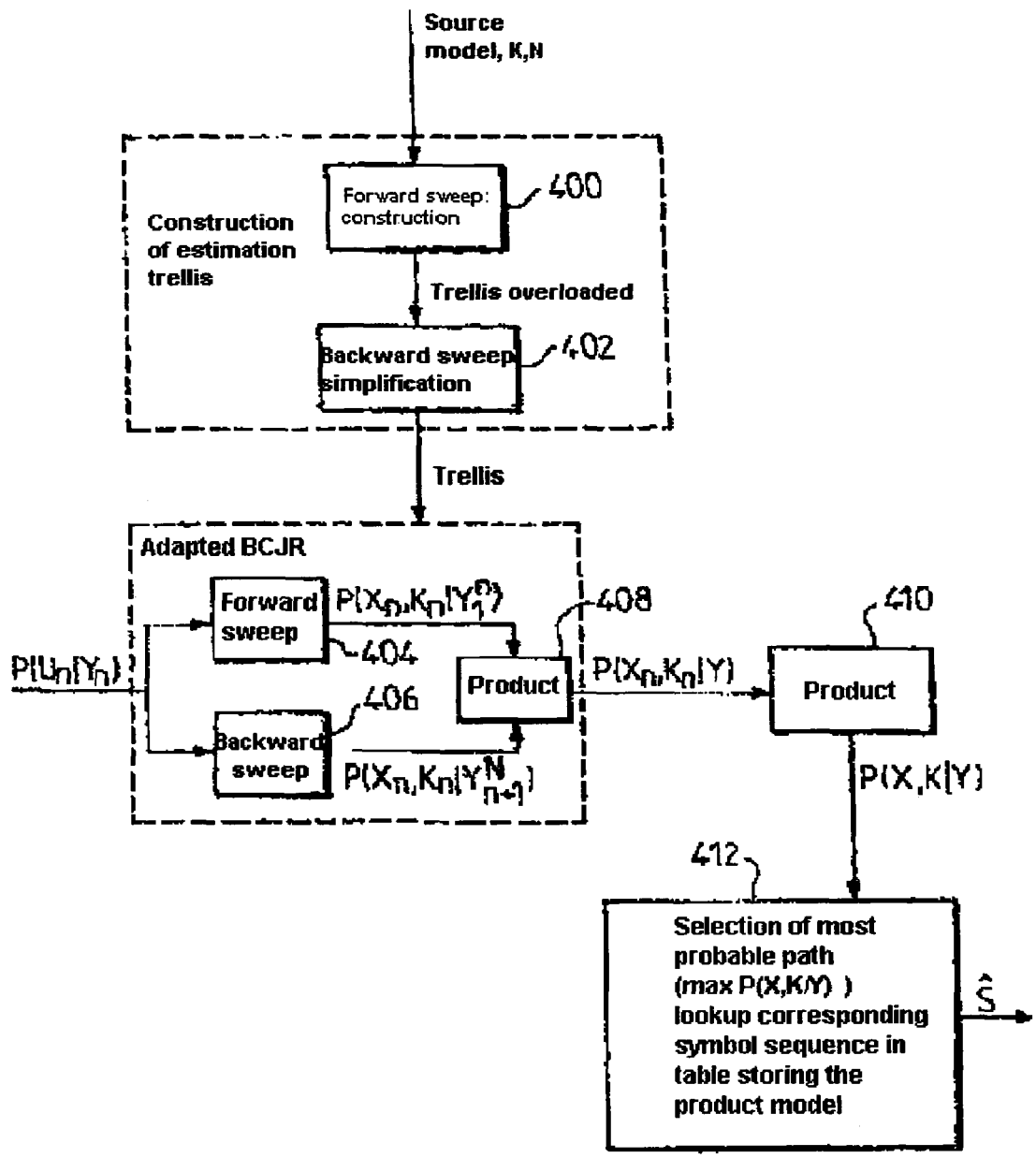
Figure 13:
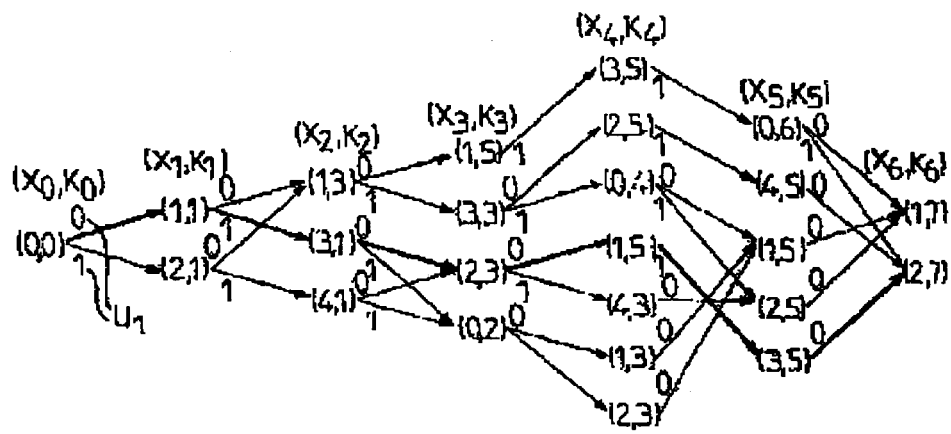
Figure 14:
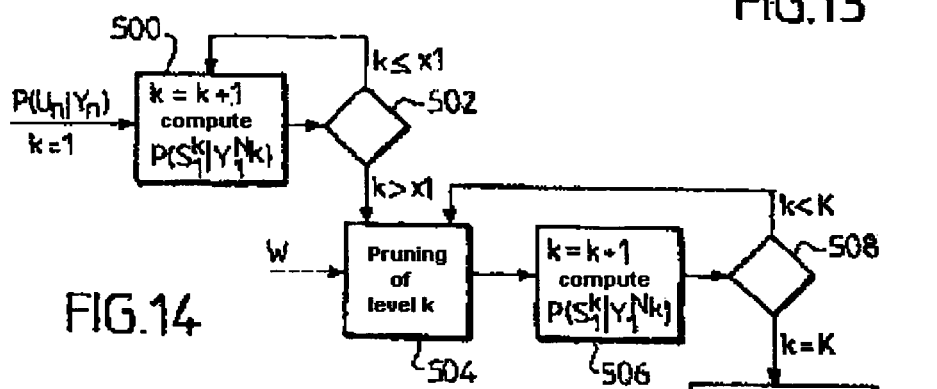
Figure 15:
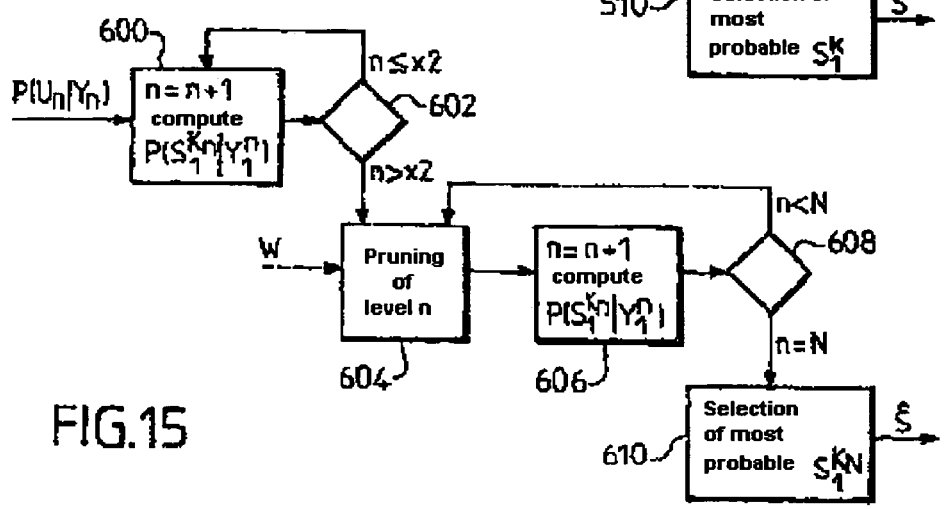

Other features and advantages of the invention will become apparent upon examination of the following detailed description together with the attached drawings in which:

FIG. 1 illustrates an arrangement comprising an encoder and a decoder according to the invention, FIG. 2 is a general view of the encoding method implementable in an encoder according to the invention, FIG. 3 is a diagram providing a general view of the decoding method implementable in a decoder according to the invention, FIGS. 4A, 4B and 4C illustrate three different representations of the same so-called "source" model establishing a correspondence between the source symbols and sequences of bits, FIGS. 5A and 5B illustrate two different representations of the same correspondence between sequences of symbols and sequences of bits, based on the so-called "source" model in FIGS. 4A and 4B, Table 1 illustrates a representation in table form of a so-called "encoder" model, Table 2 illustrates a representation in table form of a so-called "decoder" model", FIG. 6A illustrates a representation in table form of a so-called "source-encoder product" model according to the invention, FIG. 6B illustrates a representation in trellis form of the so called "source-encoder product" model in FIG. 6A according to the invention, FIGS. 7A and 7B illustrate two partial representations in trellis form of the so-called "encoder" model in Table 1, FIG. 8 illustrates a generalized representation of a so-called "source-encoder product" model according to the invention, FIG. 9A illustrates a representation in table form of a so-called "source-decoder product" model according to the invention, FIG. 9B illustrates a representation in trellis form of the so called "source-decoder product" model in FIG. 9A according to the invention, FIG. 10 illustrates a generalized representation of a so-called "source-decoder product" model according to the invention, FIG. 11 illustrates the decoding method in a first embodiment of the invention, FIG. 12 illustrates the decoding method in a second embodiment of the invention, FIG. 13 illustrates a representation in trellis form based on the decoding method in FIG. 11 or 12, FIG. 14 illustrates the decoding method in a third embodiment of the invention, FIG. 15 illustrates the decoding method in a fourth embodiment of the invention.

In addition:

Appendix 1 contains mathematical expressions used in the present description.

The drawings and the attachments to the description essentially include elements that are certain in character. They will therefore serve not only to aid understanding of the description, but will also contribute to the definition of the invention, as applicable.

In a general manner, a compression system for multimedia signals (image, video, audio, voice) uses statistical codes also termed variable length codes. These make it possible to obtain rates approaching what the specialists refer to as "signal entropy". The codes most widely used in existing systems (particularly in the standards) are Huffman codes which have been described in the following paper: D. A. Huffman: "A method for the construction of minimum redundancy codes", Proc. IRE, 40 (1951), p. 1098–1101.

More recently, there has been renewed interest in arithmetic codes owing to their increased performance in terms of compression. In effect these codes make it possible to decouple the encoding method from the supposed source model. This facilitates the use of higher-order statistical models. These arithmetic codes have been described in research papers such as

[1]—J. J. Rissanen "Generalized kraft inequality and arithmetic", IBM J. Res. Develop., 20:198–203, May 1976

[2]—J. J. Rissanen, "Arithmetic coding as number representations", Acta Polytech. Scand. Math., 31:44–5.1, December 1979 and in American patents U.S. Pat. Nos. 4,286,256, US 4,467,317, US 4,652,856.

Until recently, the design of compression systems was undertaken assuming a guaranteed quality of transport service. It was assumed in effect that the lower layers of the OSI model incorporate error correction codes ensuring a quasi-null residual error rate as seen from the application.

Variable length codes could therefore be widely used despite their considerable sensitivity to transmission noise. This hypothesis of a quasi-null residual error rate no longer holds true in wireless and mobile networks in which the channel characteristics vary over time (non-stationary channels). This residual error rate seen by the source signal decoder is often far from negligible. Any error in the binary stream can cause desynchronization of the decoder and therefore propagation of errors to the decoded information stream.

To mitigate this propagation problem, the first-generation standards (H.261, H.263, MPEG-1, MPEG-2) incorporated synchronization markers into the syntax of the transmitted binary stream. These are long code words (16 or 22 bits composed of a string of 15 or 21 bits set to '1' followed by a '0') which cannot be emulated by errors occurring in the other code words and which can therefore be recognized by the decoder with a probability close to '1'.

This leads to the binary stream being structured in packets delimited by these synchronization markers. This enables the propagation of errors to be confined within a packet.

However if an error occurs at the start of the packet the rest of the packet may be lost. Moreover, the frequency of these synchronization markers must be restricted to avoid undue loss of compression efficiency.

The new standards (H.263+ and MPEG-4) then adopted reversible variable length codes (RVLC). A particular feature of these codes is that they can be decoded from the first to the last bit in a packet, and inversely from the last to the first bit in the packet.

If an error has occurred in the middle of a packet, this code symmetry makes it possible to confine the error propagation to a segment in the middle of the packet instead of propagating it to the end of the packet delimited by a synchronization marker. However, the code symmetry results in a loss of compression efficiency in the order of 10% compared with a Huffman code. In addition, reversible variable length codes do not completely overcome the problem of error propagation: if an error occurs at the start and end of a packet, the whole packet is liable to be erroneous.

The design of encoding/decoding methods robust relative to transmission noise and based on a family of codes highly efficient in compression terms (i.e. which make it possible to approach entropy of the source) is an important goal, in particular for future multimedia (image, video, audio, voice) mobile communications systems. New standards are being developed for these systems both within the ITTU (International Telecommunication Union) and ISO (International Standardization Organization).

Although standards play a predominant role in the telecommunications sector, such a family of codes could also find applications in niche markets calling for proprietary solutions.

The invention described in particular concerns an encoder/decoder device for a family of codes widely used in compression systems such as arithmetic type codes including arithmetic codes, and quasi-arithmetic codes.

The principles of arithmetic and quasi-arithmetic encoding are described below. They are developed in greater detail in ref. [2] and in the following papers

[3]—I. H. Witten and R. M. Neal and J. G. Cleary. Arithmetic coding for data compression. Communications of the ACM, 30(6):520–540, June 1987,

[4]—P. G. Howard and J. S. Vitter, Image and Text Compression, pages 85–112. Kluwer Academic Publisher, 1992.

In the remainder of the description, use of the term "sequence" refers to a flow or a series of elements. For example, a sequence of bits, respectively of symbols, will denote a flow or a series of bits, respectively of symbols.

In a general manner, the encoding principle involves the following steps:

Let $A=A_1 \ldots A_l$ be a sequence of quantified source symbols which take their value from a finite alphabet A composed of $M=2^q$ symbols, $A=(A_1 \ldots A_M)$. This alphabet has a stationary distribution which indicates an associated stationary probability for each symbol. This sequence of M-ary symbols (also termed source A) is converted into a sequence of x-ary symbols (with $x \leq M$). In the case where this sequence of M-ary symbols is converted into a sequence of binary symbols $S=S_1 \ldots S_K$, (also termed source S), K is defined by $K=qxL$. The variables M and x define integers starting from 2. Thus, in the example, x=2 and M=4.

By way of example only, in the remainder of the description and for reasons of simplification, it will be assumed that x=2. This conversion uses a source model as described below including a correspondence between the M-ary source. A and the binary source S. This sequence of binary symbols S is converted in turn into a sequence of first binary information elements $U=U_1 \ldots U_N$, via a quasi-arithmetic encoder of precision T. The length N of this binary stream is a random variable, function of S, the sequence of binary symbols, itself function of A, the sequence of M-ary symbols. The stream of first binary elements U is transmitted, by way of example only, on a memory-less channel. This stream of first binary elements U is received as a stream of second binary elements Y by reason of errors introduced during transmission by the communication channel. The lower layers of the communication system in effect make it possible to determine at least the current properties Ic of the communication channel, for example the error rate introduced by the channel into the bits communicated, and confidence measurements on bits received. These latter measurements make it possible to estimate probabilities of receiving a second binary element knowing a first binary element communicated on the channel. These probabilities are estimated as indicated in the attachment (equation 21 with the index i being an integer) based on one of the current properties Ic of the channel p, the probability of error on the channel.

The principle of decoding entails estimating the sequence of symbols A, knowing the second binary elements also referred to below as the sequence of "observations y". In the remainder of the description, capital letters will be used to denote the random variables, and small letters will be used to denote the representations, or observations of these variables. To denote a series of successive variables, the notation $X_u^v=(X_u, X_{u+1} \ldots X_v)$ is used.

The encoding/decoding principle can also be directly applied to a source corresponding not to M-ary symbols (A) with M>2 but to binary symbols (S) with M=2. In the remainder of the description, an x-ary symbol, respectively an M-ary symbol, in particular includes the case of the binary symbol (x=2, respectively M=2) and the case of the symbol for which x>2, respectively M>2.

FIG. 1 illustrates an example of a combination encoder 1 and decoder 2. The encoder and decoder respectively have an input Ec, Ed and an output Wc, Wd. During encoding, a flow of x-ary symbols to be encoded is received at the encoder input at Ec. The encoder outputs at Wc a flow of first binary elements, termed the first bit stream Uc, generated by encoding the flow of x-ary symbols, for example in compressed form. This first bit stream Uc is sent, via a channel 11, to the input Ed of the decoder 2. The channel, having introduced possible errors into the first bit stream (for example by inverting certain bits in the first flow), transmits a flow of second binary elements, termed second bit stream Yd, to the input of the decoder 2. According to the invention, a processing module 6 receives and processes this second bit stream together with the channel properties Ic, communicated by the channel, to obtain a flow of symbols Sd at the output Wd of the decoder. A processing module 6 is designed to operate with the models module 12. This models module includes a source model 8 designed to define probabilities for x-ary symbols associated with transitions between source states in a source state diagram described below, a so-called "product" model 7 used to define a correspondence between the x-ary symbols and first binary elements, based on states in a "product" states diagram, a product state being a function of a source state and a state of a transfer model.

The product model 7 is defined on the basis of the source model 8 and a transfer model 9 or 10. The product model can be constructed dynamically from the source model and the transfer models 9 or 10. In another possible embodiment, the product model can be implemented in the models module without being constructed dynamically. The transfer model includes an encoding model 9 or a decoding model 10. This transfer model serves to establish a correspondence between binary symbols and first binary elements, as a function of probabilities associated with binary symbols.

It is also possible to start from a sequence of M-ary symbols capable of being pre-transformed into a sequence of x-ary symbols before being compressed using the source model.

In a possible embodiment, these models can be pre-computed and stored in memory in a module external to the models module of the decoder. They can also be used remotely, for example using an Ethernet type local network or an Internet type wide area network.

The processing module 6 is adapted to calculate probabilities of x-ary symbols, knowing the bits of the flow of second binary elements, based on the properties Ic of the channel, the source model and the product model. The processing module 6 is adapted to reconstitute the most probable flow of x-ary symbols from; these computed probabilities and to reconstitute the flow of M-ary symbols from the source model if a flow of M-ary symbols has been coded.

The method deriving from this device according to the invention is described in the remainder of the description and will in particular facilitate a better understanding of the operation of such a device.

FIG. 2 illustrates an example of an encoding method capable of using the insertion of synchronization markers. This process is implemented in an encoder receiving a source (M-ary), for example a sequence of data, at its input.

At step 100, when the sequence of data does not require M-ary markers, the process continues at step 104. If, on the other hand, M-ary markers need to be inserted into the sequence of data, the frequency, size and value of these markers are supplied by the encoder to facilitate insertion of these markers at step 102.

At step 104, a check is made to determine whether the sequence of data (which may or may not include synchronization markers) requires an M-ary/binary conversion. If this is not the case, the sequence of data is therefore binary and undergoes arithmetic encoding (quasi-arithmetic in the example in the drawing) at step 112. Otherwise, the M-ary/binary conversion of the sequence takes place at step 106. At step 108, if binary markers have to be inserted, the frequency, size and value of these markers are supplied by the encoder to facilitate insertion of these markers at step 110.

At step 112, the sequence of M-ary or binary data undergoes quasi-arithmetic encoding, the complexity of which is controlled by the parameter T. If T is large, the quasi-arithmetic encoding becomes identical to arithmetic encoding. This results in maximum compression of the sequence of binary data into a stream of bits.

FIG. 3 illustrates an example of the decoding method taking into account inserted synchronization markers. This method is implemented in a decoder receiving at its input the binary stream and information relating to the M-ary or, x-ary source (in particular binary), together with the frequency, size and value of any synchronization markers.

At step 120, different modes of decoding can be selected:
instantaneous decoding at step 124,
sequential decoding according to the invention, as detailed in the remainder of the description, at step 122,
optimal decoding, as detailed in the remainder of the description, according to the invention at step 126.

At step 128, a check is made to determine whether the sequence of data obtained after decoding requires binary/M-ary conversion.

If such is the case, the sequence of data is therefore binary and a check is made at step 130 to determine whether the sequence of data includes binary markers. If such is the case, these markers are removed at step 132 using the information on their frequency and size. After step 130 or step 132, the sequence of data undergoes binary/M-ary conversion at step 134.

After step 128 or 134, a check is made at step 136 to determine whether the sequence of data includes M-ary markers. If this is not the case, decoding of the data sequence (or source) is completed; otherwise the markers are removed at step 138 to obtain the data sequence (or source).

FIGS. 4 to 5 illustrate source models for M-ary/binary and binary/M-ary conversion of a data sequence (or source).

FIG. 4A illustrates the binary representation of the 4 symbols of a 4-ary source, i.e. a source taking its value from a 4-ary alphabet. This source model can be a binary tree of depth q, as shown in FIG. 4A for q=2 and M=4. In a variant, this tree can be represented by a correspondence table. The black node is termed the root of the tree, the white nodes are the intermediate nodes, and the grey nodes are termed the leaves of the tree. The probabilities P of each M-ary symbol correspond to the stationary probabilities of the source. The probabilities of transition (not shown) on the branches of this binary tree are computed from the stationary probabilities.

FIG. 4B illustrates the automaton enabling conversion of the sequence of independent M-ary symbols into a sequence of binary symbols. This source model can also be represented in FIG. 4B in the form of a three-state automaton: C=0 being the initial state, C=1 and C=2 the intermediate states. As a variant, this source model can be represented in FIG. 4C in the form of a trellis with the same states C=0 on the left, the initial state connected to the intermediate states C=1 and C=2 on the right, these intermediate states, on the left, being connected to the state C=0 on the right. Also, in this example, the probabilities of each x-ary symbol (in this case binary symbol) are indicated on the corresponding transitions.

For a data flow including several non-independent M-ary symbols, a complete model of the source is obtained by connecting successive local models as shown in FIG. 5A. A local model corresponds to a source model for a flow including a symbol as illustrated in FIG. 4A. In reference to FIG. 5, for a flow of two dependent M-ary symbols, the complete model of the source involves identifying the leaves of the first binary tree with the root of the following tree, the root being represented by a black node in FIGS. 5A and 5B. FIG. 5A thus combines binary trees with each other. As a variant, FIG. 5B combines a first binary tree with corresponding automatons taking as their initial and final state the leaves of the binary tree. This automaton serves to convert a sequence of dependent M-ary symbols into a sequence of binary symbols.

According to FIG. 5A, the states $C_k$ define the possible nodes in which the automaton can be after the production of k binary symbols. This set of possible nodes is symbolized in the drawing by a dash-dot line connecting nodes of the same state k. The sequence $C_0, \ldots, C_K$ is a Markov chain and the corresponding flow of binary symbols is a function of the transitions of this chain. The transitions, referred to as $S_k$ in that they engender the transmission of binary symbols $S_k$, represent the set of possible transitions between the set of states $C_{k-1}$ and the set of states $C_k$ of the source model.

From this stochastic automaton, the flow of binary symbols can be modeled by a hidden Markov model.

Knowing each stationary probability associated with each binary symbol, each of these probabilities corresponding to one of the segments of the unitary interval [0,1[, the arithmetic encoding makes it possible, for a sequence of binary symbols, to determine the interval of this sequence. The latter represents a segment of the unitary interval and its lower bound is derived from the sum of the probabilities of symbol sequences corresponding to the lower sub-intervals. The width of this interval is given by the probability of the symbol sequence corresponding to this interval. The term "current interval" refers to the interval corresponding to a part of the sequence and therefore to the current state $C_k$ of this part of the sequence, during computation of the interval or sub-segment associated with the sub-sequence corresponding to the state $C_k$.

Practical implementations of arithmetic encoding were first introduced in ref. [1], the following paper:

[5]—R. Pasco. Source coding algorithms for fast data compression. PhD thesis, Dept. of Electrical Engineering, Stanford Univ., Stanford Calif., 1976 and revisited in ref. [2]. A problem that arises in this implementation is the need for a high degree of numerical precision to represent intervals with very small real numbers. This difficulty can be resolved by relying on binary representation of the real numbers in the interval [0,1 [, which is described in ref. [3]. Any number belonging to the interval [0,0.5[ has its first bit equal to 0, whereas any number belonging to the interval [0.5,1[ has its first bit equal to 1. Consequently, during the encoding process, when the current interval is wholly contained in [0,0.5[ or [0.5,1 [, the corresponding bit is transmitted and the size of the interval is doubled. Specific treatment is required for intervals that, straddle ½. If the current interval straddles ½ and is wholly contained in [0.25,0.75[, it cannot be identified by a single bit. Its size is still doubled, without transmitting a bit, and the number of times (n) that this operation is performed before transmitting a bit is stored. n is the number of rescalings performed since the last transmission of a bit. When an interval for which a bit $U_i=u_i$ is transmitted is reached, this bit is then followed by the sequence of n times the bit of opposite value.

Use of this technique ensures that the current interval permanently satisfies the condition low <0.25<0.5≦high or low <0.5<0.75≦high, with low and high being respectively the lower and upper bounds of the current interval.

The arithmetic encoding principle can be modelled by a stochastic automaton of which the states E are defined by three variables: low, up and $n_{scl}$ the number of rescalings. The drawback of this encoding is that a very large number of states can exist if the stationary distribution of the source is not known a priori or if the flow includes a large number of x-ary symbols. Quasi-arithmetic encoding, also called reduced-precision arithmetic encoding, can reduce the number of possible states without significantly degrading compression performance, as described in ref. [4]. To perform quasi-arithmetic encoding, the actual interval [0,1[ is replaced by the integer interval [0,T[. The integer T serves to control the trade-off between complexity and compression efficiency: if T is large, then the interval subdivisions will follow closely the distribution of the source. In contrast, if T is small (close to 1), all the possible interval subdivisions can be pre-computed, and these subdivisions will only represent an approximation of the distribution of the source.

As shown in Table 1, all of the transitions between states and the corresponding emissions of bits can be pre-computed. The arithmetic operations are then replaced by table lookups.

A sequence $S_1^K$ of binary symbols is converted into a bit stream $U_1^N$ by a binary tree. This tree can be regarded as an automaton or a encoder model which models the distribution of the binary stream. The encoding of a symbol determines the choice of a vertex in the tree, to which the emission of bits can be associated. Each node corresponds to a state E of arithmetic encoder. Successive transitions between these states follow the distribution of the source $P(S_k|S_k\cdot i)$ for an order-1 Markov source. Let $E_k$ be the state of the automaton at each "symbol instant" k. As in the case of arithmetic encoding, the state $E_k$ of the quasi-arithmetic encoder is defined by three variables: $lowS_k$, $upS_k$ and $nscl_k$. The terms $lowS_k$ and $upS_k$ denote the bounds of the interval resulting from successive subdivisions of [0,T[corresponding to the encoding of the sequence $S_1^K$. The quantity $nscl_k$ is reset to zero each time a bit is emitted and incremented each time a rescaling takes place without emission of a bit. It therefore denotes the number of scalings performed since the last emitted bit. When a bit is emitted, it is followed by $nscl_k$ bits of opposite value.

Since there is a finite number of possible subdivisions of the interval [0,T[, it should be possible to pre-compute all of the states of the quasi-arithmetic encoder without knowledge of the source.

By way of example,. Table 1 presents the states, outputs and all the possible transitions of a quasi-arithmetic encoder of precision T=4 for a binary source. Reference will be made in the first instance to column groups C1 and C2. The value of the variable $nscl_k$ is not included in the state model. Only the increments of this variable are signaled by the letter f in the Table as in ref. [4].

The encoder has three possible states corresponding to integer subdivisions of the interval [0,4[defined by the current interval [$lowS_k$, $upS_k$[. Reference will be made to:

[6]P. G. Howard and J. S. Vitter, Design and Analysis of fast text compression based on quasi-arithmetic encoding. In Data Compression Conference, pages 98–107, Snowbird, Utah, March-April 1993, for the choice of these subdivisions. Depending on the probability of the input binary symbol 0, the current interval [$lowS_k$, $upS_k$[will be subdivided into integer intervals. Depending on whether, in column C2, the input binary symbol is 0 or 1, the subdivisions into possible integer intervals of the current interval [$lowS_k$, $upS_k$[result in the emission of bits indicated or appropriate rescaling before determining the next state of the automaton.

In the case where the input symbols are binary symbols, the number of states can be further reduced by identifying the binary symbols as "less probable" (LPS) and "more probable" (MPS) in column C3, rather than as 0 and 1 in column C2. This amounts to considering the probability of each binary symbol rather the value of the binary symbol, the MPS and LPS corresponding either to a 0 bit or a 1 bit. The number of possible combinations of the binary source probabilities is reduced. This makes it possible to combine certain transitions and to eliminate states of the automaton.

The sequence $E_0 \ldots E_k$ of successive states of the quasi-arithmetic encoder forms a Markov chain and the outputs of the encoder are functions of the transitions on this chain.

In the same way as quasi-arithmetic encoding, decoding can be modeled by a stochastic automaton with a finite number of states $E_N$ as shown in Table 2.

The state of an arithmetic decoder is defined by two intervals: $[lowU_n, upU_n[$ and $[lowS_{Kn}, upS_{Kn}[$. The interval $[lowU_n, upU_n[$ corresponds to the segment of the interval $[0,1[$ defined by the reception of the sequence of bits $U_1^n$. The interval $[lowS_{Kn}, upS_{Kn}[$ is the segment of the interval $[0,1[$ obtained when the sequence of symbols $S_1^{Kn}$ has been decoded. This interval is updated by cumulating the probabilities of each decoded binary symbol, in the same manner as encoding for each encoded symbol. It reproduces the operation of the encoder.

An arithmetic encoder and decoder are not synchronized. In effect, on encoding, the reception of a symbol does not necessarily result in the emission of a bit. Similarly, on decoding, reading of a bit does not necessarily result in the production of a symbol. Thus, if reading of a first symbol in the sequence to be encoded does not result in the emission of a bit, it may be that, on decoding, reading of the first bit will suffice to decode the first symbol. Both intervals are scaled as on encoding to avoid numerical precision problems.

In the example in Table 2, a stochastic automaton is defined for a value of T=4. The table gives the states, transitions and outputs of a quasi-arithmetic decoder for a binary source with T=4 and the MPS/LPS simplification.

Let $E_n$ be the state of this automaton at the "bit instant" n, i.e. at the instant of processing of the received bit $U_n$. This state is defined by the values of the intervals $[lowU_n, upU_n[$ and $[lowS_{Kn}, upS_{Kn}[$. Depending on the stationary distribution of the source (shown in column K1 by the probability of the most probable MPS, symbol), the current interval $[lowS_{Kn}, upS_{Kn}[$ will be subdivided into integer intervals. Depending on whether the input bit is $U_n=0$ in column K2 or $U_n=1$ in column K3, the possible subdivisions into integer intervals of the current interval $[lowS_{Kn}, upS_{Kn}[$ result in the emission of MPS or LPS symbols indicated or to appropriate rescaling before determining the next state of the automaton.

An encoder, respectively a decoder, using the stochastic automaton in: Table 1, respectively Table 2, starts at state $E_k=1$, respectively $E_n=1$.

Different models are envisaged according to the invention for use in encoding/decoding methods and for implementation in corresponding encoders/decoders. Thus, a so-called "product" model is envisaged that can be a model resulting from the product of the source models and encoder or a model resulting from the product of the source models and decoder.

In a general manner, the states of the product model must gather the information contained in the states of each of the two models (source and encoder or-source and decoder). In the general case, the size of the state-space of the "product model" cannot be known a priori. It can be computed from the binary source model and the parameter T.

For a source/encoder -product model, as the number of bits in each binary element produced by each transition of the product model is random, the structure of the dependencies between the sequence of second binary elements and the states of the product model is random. In order to "capture" this dependency structure, the Markov process represented by the states $X_k$ of the encoder according to the product model is augmented by a counter $N_k$ to obtain the next dependency structure $(X,N)=(X_1,N_1) \ldots (X_K,N_K)$. Each state $X_k$ of the product model is defined by the state of the encoder model, the state of the source model and the number of bits emitted when the k-th symbol has been encoded: $(X_k,N_k)=(lowS_k, upS_k, C_k, N_k)$. This yields the structure of dependencies depicted graphically in FIG. 8. According to this structure, a sequence of binary symbols $S_1^K$ is converted into a sequence of bits $U_1^{NK}$ where $N_K$ is the number of bits emitted when K symbols have been encoded. Given a state $X_{k-1}$ and an input symbol $S_k$, the product model specifies the bits $U_{Nk+1}$ to $U_{Nk}$ that have to be emitted and the next state $X_k$. No bits may be emitted by certain transitions. The probabilities of transitions between $(X_k,N_k)=(lowS_k, upS_k, C_k, N_k)$ and the next state in the trellis $(X_{k+1},N_{k+1})=(lowS_{k+1}, upS_{k+1}, C_{k+1}, N_{k+1})$ are given by the binary source model, $P(C_{k+1}|C_k)=P(S_{k+1}|C_k)$. The second binary elements $Y_{Nk-1+1}$ to $Y_{Nk}$ are obtained at the output of the transmission channel when the first binary elements $U_{Nk-1+1}$ to $U_{Nk}$ have been emitted. These second binary elements are observations on the first binary elements.

A example of a product model derived from the source and encoder models is presented in FIGS. 6 and 7. The product model example defined in the table in FIG. 6A is derived from the product of the source model in FIG. 4C and the encoder model in Table 1. In theory, the size of the state-space resulting from this product is given by the product of the state-space dimensions of the two models (source and encoder). However, simplifications occur which result in a smaller number of states.

The arithmetic encoder model in Table 1 (T=4) using the simplified state model in column C3 has been represented in trellis form in. FIGS. 7A and 7B, FIG. 7A corresponding to a probability $0.63 \leq P(MPS)$, and FIG. 7B corresponding to a probability $0.37 \leq P(MPS) \leq 0.63$. Either of these figures can be used depending on the probabilities of the binary source. The probabilities of the binary source resulting from a conversion based on an M-ary source depend on the state $C_k$ of the model of this binary source. The transitions of the source/encoder product model are thus a function of the source distribution. The table in FIG. 6A is constructed as a function of the states $C_k$ of the source model in FIG. 4C, the probability of transitions $S_k$, the transitions $S_k=0$ and $S_k=1$ in FIG. 4C being modified as $S_k=LPS$ and $S_k=MPS$, and of the transitions of the encoder model depicted in FIGS. 7A and 7B as a function of the source probability. Column M1 in FIG. 6A only contains 4 states of the product model defined in column M2 by the state variables of the source model and the corresponding encoder. As the source model has 3 states and the encoder model has 2 states; the product model will have a maximum of 6 states. In practice, simplifications occur as explained below with the aid of FIGS. 7A and 7B. FIG. 7A shows that for a state $E_k=0$ of the encoder, it is possible to continue in a state $E_k=1$ of the encoder for a probability of the source model $0.63<P(MPS)$. However, FIG. 7B indicates that it is not possible to reach the state $E_k=1$ of the encoder from the state $E_k=0$.

Thus, in the product model in FIG. 6A, no state of the product model $X_k=4$ and $X_k=5$ corresponding to pairs of states of the source and encoder model ($E_k=1$, $C_k=1$) and ($E_k=1$, $C_k=2$) exists for the probability condition such that 0.37<P(MPS)<0.63 of the source model. Columns M3 and M4 indicate, for the input symbol (MPS or LPS), the bits emitted and the next state of the product model.

For a source/decoder model according to FIG. 9A or 9B, the states of this product model must gather the state information of the source and decoder models. A state $X_n$ of this product model is therefore defined by $X_n$=(low$U_n$, up$U_n$,low$S_{Kn}$,up$S_{Kn}$,$C_{Kn}$) $K_n$ being the number of symbols decoded when n bits have been received. The number of symbols produced by each transition of the product model is random. Consequently, the structure of dependencies between the sequence of second binary elements and the decoded symbols is random. The Markov chain X...$X_N$ of the source/decoder product model is augmented by a counter variable $K_n$, to give the Markov chain (X,K)=($X_1$,$K_1$)...($X_N$,$K_N$) which results in the structure of dependencies depicted in FIG. 10. According to this structure, a sequence of bits $U_1^N$ is converted into a sequence of symbols $S_1^{KN}$, where $K_N$ is the number of symbols decoded when N bits have been received. Given a state $X_n$ and an input bit $U_{n+1}$, the automaton produces the sequence of binary symbols $S_{Kn+1}^{Kn+1}$, and specifies the next state $X_{n+1}$. The probabilities of transitions between ($X_n$,$K_n$) and ($X_{n+1}$,$K_{n+1}$) in the trellis depend on the binary source model. They are given by attached formula (17). As in the case of the source/encoder model, simplifications of the states of this model are possible depending on the decoder model and source model used. In the example in FIG. 9A or 9B, the source model used is that of FIG. 4C and the decoder model that of Table 2.

The robust decoding methods for arithmetic codes are based on the dependency models previously described.

A first implementation of the robust decoding method is depicted in FIG. 11.

Reference is made to Appendix 1 for the associated mathematical development.

The decoder receives the stream of bits to be decoded at its input. The source model, the variable N representing the number of bits received to be decoded and the probability P($U_n$,$Y_n$) of having emitted a first bit (or first binary element) $U_n$ knowing the observed second bit (or second binary element) $Y_n$ are input data for the decoder, i.e., by way of example only, these data can be received at the input with the bit stream to be decoded or can be read from a memory accessible by the decoder. The probability P($U_n$/Yn) can be obtained from the channel properties.

The MAP (Maximum A Posteriori) criterion corresponds to the optimal Bayesian estimation of a process X based on available observations Y as indicated by equation (3) in Appendix 1. The optimization is performed for all possible "sequences". In this first implementation, this criterion is applied to the estimation of hidden states of the processes (X,N), which can be considered as symbol-clock processes, and of the processes (X,K), which can be considered as bit-clock processes, given the bit sequences observed. The estimation can be run either as a bit-clock or a symbol-clock process. For reasons of simplicity of implementation, bit-clock estimation is favored.

In this case, estimation of the set of hidden states (X,K)=($X_1$,$K_1$)...($X_N$,$K_N$) is equivalent to estimation of the corresponding sequence of decoded symbols S=$S_1$...$S_{Kn}$...$S_{KN}$, given the observations $Y_1^N$ at the channel output. The best sequence (X,K) can be obtained from the local probabilities on the pairs ($X_n$,$K_n$) using equation (4).

The computation of P($X_n$,$K_n$|Y) can be performed using decomposition equation (5) where α denotes a normalization factor. The dependencies of the Markov chain allow recursive computation of both terms on the right-hand part of this equation, based on the BCJR algorithm described in ref.

[7] L. R. Bahl, J. Cocke, F. Jelinek, and J. Raviv. Optimal decoding of linear codes for minimizing symbol error rate. *IEEE trans. on transformation theory*, 02:284–287, March 1974.

Thus, at step 300, the trellis is first constructed using the source/decoder model in FIG. 9A for example, and the corresponding probabilities are computed for each transition of the trellis. Thus, based on the product model, a forward sweep allows successive construction of states connected by transitions of the product states diagram from an initial state to a final state. Each state defines an expected number of decoded symbols for a given number of past bits in the flow of second binary elements from the initial state. During this same step, the forward sweep of the BCJR algorithm makes it possible to compute the term P($X_n$=$x_n$,$K_n$=$k_n$|$Y_1^n$) of the decomposition as the sum of the set of possible values of $x_{n-1}$,$k_{n-1}$ of the product of three conditional probabilities (equation (6)): the recursive probability, the probability of transition between the states ($x_{n-1}$,$k_{n-1}$) and ($x_n$,$k_n$) given by the product model (as indicated in equation 17 and representing the product of the probabilities of transition P($S_k$|$C_{k-1}$) previously in the source model) and the probability of having emitted the bit $U_n$ (which may be 0 or 1) triggering the transition between the states ($x_{n-1}$,$k_{n-1}$) and ($x_n$,$k_n$) given the second binary element $Y_n$. The latter probability is obtained from the channel properties. The recursive computation is initialized at the starting state (0,0) and allows computation of P($X_n$,$K_n$|$Y_n^1$) for any possible state ($x_n$,$k_n$) with n=1 ... N of the bit-clock. Thus, this forward sweep facilitates construction of the product model trellis and computation of the successive probabilities P($Y_n$,$K_n$|$Y_n^1$), and for each instant n, of ending at a given state ($X_n$,$K_n$) given bits of the second binary element stream $Y_1^n$.

At step 302, the backward sweep serves to obtain the term P($Y_{n+1}^N$|$X_n$=$x_n$, $K_n$=$k_n$) of the decomposition for any possible state ($x_n$,$k_n$) at each bit instant n consecutively from N to 1; This term is computed as the sum of the product of three conditional probabilities (equation (7)): the recursive probability initialised for all possible "last states" ($X_N$,$K_N$), the probability of transition between states ($X_{n+1}$,$K_{n+1}$) and ($X_n$,$K_n$) given by the product model and the probability of having emitted the bit $U_{n+1}$ triggering the transition between states ($X_{n+1}$,$K_{n+1}$) and ($X_n$,$K_n$) given the second binary element $Y_{n+1}$. As before, the latter probability is obtained from the channel model. Thus, this backward sweep allows computation of the successive probabilities P($Y_{n+1}^N$|$X_n$=$x_n$, $K_n$=$k_n$), and for each instant n from N to 1, of observing bits of the second binary elements stream $Y_1^n$ knowing a given state ($X_n$,$K_n$)

When the number of symbols K is known, a termination constraint can be added during the backward sweep at step 302. Thus, all paths in the trellis which do not lead to the right number of symbols $K_N$=K are suppressed. Thus, the backward sweep includes the successive suppression of states from the product states diagram, from the final state to the initial state, for which the expected number of symbols for a given number of bits in the second binary elements stream is different from a known maximum number of symbols. Thus, the first sweep at step 300 starts at the initial state of the trellis and successively constructs the different sections of the trellis. During this forward sweep, it is not possible to know which paths do not satisfy the termination constraint. Once the forward sweep is finished, the states of the last section (n=N) of the trellis which do not satisfy the constraint are suppressed. The backward sweep then allows suppression of all branches that do not terminate.

At step 304, the obtained probabilities of forward and backward sweeps are combined in the form of a product for each value of n ranging from 1 to N to obtain the probabilities $P(X_n, K_n|Y)$ for each state n. In this manner, the probabilities associated with transitions of the constructed trellis are estimated.

At step 306, the product of equation (4) is performed on the probabilities $P(X_n, K_n|Y_1^n)$ with n ranging from 1 to N. This product is performed for the different possible combinations of these probabilities. Thus, the highest probability $P(X,K|Y)$ is retained and the probabilities $P(X_n, K_n|Y)$ constituting this product are used to determine the most likely path in the trellis. Based on the trellis and the corresponding table of the source/decoder product model, it is possible to determine the symbols corresponding to this path and to reconstitute a sequence of symbols $S_1^K$.

In another possible implementation, the trellis on which the estimation is made can be pre-computed and stored on the basis of the source/decoder product model and the length N of the observed sequence of bits. Thus, in reference to FIG. 12, based on the source/decoder model and the values of K and N, the trellis is constructed at step 400 in a single forward sweep and simplified by a backward sweep at step 402. This trellis is stored in memory for use whenever a bit stream arrives for which the source/decoder model and the values K and N are the same.

For a stream of received bits including N=6 bits, for a known number of symbols to be found K=7, and for a source/decoder model as illustrated in FIG. 9A, the lattice construction is depicted in FIG. 13. This lattice includes, at each state $(X_n, K_n)$, several pair values $(X_n, K_n)$. For example, the pair $(X_1, K_1)$ can take the values (1, 1) or (2, 1) depending on whether the bit emitted $U_1$ has a value of 0 or 1.

Whenever a stream of bits arrives (having the same model, the same values of K and N as the trellis), a forward sweep and a backward sweep are performed on the bit stream at steps 404 and 406, for example in a parallel manner. The probabilities $P(X_n, K_n|Y_n^1)$ and $P(Y_{n+1}^N|X_n, K_n)$ are computed as indicated in equations (6) and (7). The product of these probabilities is obtained at step 408 for each value of n and corresponds to each transition of the trellis. The product of the probabilities for n ranging from 1 to N at step 410 is then computed as indicated in (4) to obtain probabilities $P(X,K|Y)$. The highest of these probabilities $P(X,K|Y)$ are retained in order to determine the most likely path on the trellis and the corresponding sequence of symbols.

According to the example in FIG. 13, the most likely path (obtaining the highest probability $P(X,K|Y)$ is marked in bold. The sequence of states $(X_0, K_0) \ldots, (X_N, K_N)$ makes it possible, by reading Table 8A, to determine the symbol sequence corresponding to this path.

An optimal method of decoding quasi-arithmetic codes has been presented. This method requires the creation and manipulation of an estimation trellis, such as that in FIG. 13 for example. The size of this trellis depends on the number of states of the source/decoder product model (4 states are possible for the source/decoder product model in FIG. 9A for example) and on the amplitude of the values that the variable $K_n$ can take at each bit instant n. The number of states of the source/decoder product model is itself dependent on the binary source model and on the quasi-arithmetic encoding precision parameter T. To control the trade-off between the compression efficiency of the quasi-arithmetic encoder and the complexity of the estimation method, it is therefore sufficient to control the value of the parameter T. A value of T as small as 4, for example, produces a reasonable excess rate. If maximum compression is required, however, T must have a much higher value and the minimum required value of T depends on the distribution of the source. In the majority of these cases, the value of T is too large to be able to use the optimal estimation method described above. The number of states of the source/decoder product model can also be too large to be able to pre-compute these states.

An estimation method applicable to arithmetic encoding and to quasi-arithmetic encoding is now described irrespective of the chosen precision T, i.e. irrespective of the chosen compression efficiency.

This method relies on the same source, encoder and decoder models as those seen previously. As the number of states of the encoder and decoder models is too large for them to be pre-computed, the corresponding estimation trellis cannot be constructed either. The estimation method proposed below is therefore based on the exploration of a subset of the estimation trellis, which is considered as a tree. This method is termed the sequential estimation method. It can be applied on the basis of source/encoder models and perform sequential calculations using the "symbol-clock", i.e. a counter incremented according to the number of symbols to be found. It can also be applied on the basis of source/decoder models and perform the sequential calculations using the "bit-clock", i.e. a counter incremented according to the number of bits to be decoded. This second estimation method is presented for a binary source by way of example only. It can also be applied to an M-ary source (M>2).

FIG. 14 depicts the so-called symbol-clock sequential estimation method, i.e. based on the source model/encoder. Thus, according to FIG. 8 showing the dependency structure of the source/encoder model, estimation of the sequence of states (X,N) for a stream of bits is equivalent to estimation of the sequence of transitions between these states, i.e. estimation of the sequence S given the observations Y at the channel output. This is represented by a mathematical formulation presented in (8) where a denotes a normalization factor. In the case of optimal arithmetic encoding (for a high value of T), as the bits emitted are distributed uniformly and independently, this normalization factor is $P(U_1^N)/P(Y_1^N)=1$.

At step 500, the probability of decoding a sequence of symbols (from 1 to k) knowing bits of the flow of second binary elements $P(S_1^k|Y_1^{N_k})$ for each symbol instant k can be computed in a single forward sweep using the decomposition of equation (9) where $N_k$ is the total number of bits emitted when in the state $X_k$. Taking into account the binary source model defined in equation (1) and considering a memory-less channel, the probability of observing the second binary elements corresponding to a state of the model depends only on the first binary elements for this state, this probability can be rewritten as indicated in equation (10).

The calculation is initialized as indicated in (11) with $S_1=s_1$ able to take two possible values 0 or 1 in the case of a binary source, and M possible values in the case of an M-ary source. $C_1$ is the initial state of the source model. For a memory-less channel considered, the second term of this equation modeling the noise introduced by this channel is given by equation (12) as the product, for a given state $X_k$ of the source/encoder model, of the probabilities of observing a second binary element $Y_n$ for a first binary element transmitted $U_n$. Based on this initialization, equation (10) is used to calculate $P(S_1^k/Y_1^{Nk})$ for each consecutive symbol instant k.

All possible symbol sequences being considered, the size of the estimation trellis increases exponentially with the number of symbols K. Thus, step 502 permits computation of the probabilities $P(S_1^k/Y_1^{Nk})$ for a number of symbols k ranging from 1 to x1. For the symbols from this value x1 upwards, pruning is carried out at step 504 to maintain the estimation trellis at a desired level of complexity. x1 is an integer less than or equal to the number of symbols K.

The pruning at step 504 can include different implementations. By way of example, two implementations are described below. The implementations can be combined or employed separately.

Thus, in a first implementation of the pruning operation at step 504, only the W most likely nodes of a state $(X_k, N_k)$ are chosen starting from a number k=x1 to ensure that the computed probabilities (termed likelihoods) are significant. The value of W depends on the memory resources available. Thus, for each state $(X_k, N_k)$, only the W highest probabilities among the computed, probabilities of decoding a sequence of symbols (from 1 to k) knowing bits of the flow of second binary elements $P(S_1^k/Y_1^{Nk})$ are selected and stored. In a variant, it is possible to ensure correct termination of estimation by refining this constraint. Thus, only the w most likely nodes will be selected and retained for each possible value of $N_k$ (corresponding to the symbol-clock). $N_k$ is the number of bits emitted for k symbols encoded during encoding. The relationship between W and w is given in (19) with $N_{kmax}$ and $N_{kmin}$ depending respectively on the probability of the most likely and least likely sequence $S_1^k$.

In a second implementation of pruning at step 504, the pruning criterion is based on a threshold applied to the likelihood of the paths. The likelihood of a path is given by equation (8) (symbol-clock). In this equation, the terms P(Y|U) are linked to the channel model as indicated in equation (12). $P(Y_n=y_n|U_n=u_n)$ represents the probability that a bit $y_n$ will be observed knowing that a bit $u_c$ has been transmitted or the probability of receiving a bit $y_n$ knowing that a bit $u_n$ has been emitted, which is equivalent to the probability that the observed bit is erroneous. Let p be the mean probability of binary error that is arbitrarily determined as tolerable on the channel during the estimation. Pruning involves suppressing all paths for which the mean probability of binary error at the channel output is greater than p. Thus, at each symbol instant $N_k$, the pruning criterion includes a threshold p compared to the probabilities $P(Y_{Nk}|U_{Nk})$ so that all paths on the estimation trellis for which $P(Y_{Nk}|U_{Nk})<(1-P)^{Nk}$ is verified are suppressed. Only the probabilities of decoding a sequence of symbols (from 1 to k) knowing bits of the flow of second binary elements $P(S_1^k/Y_1^{Nk})$, computed from the probabilities $P(Y_{Nk}|U_{Nk})$ higher than the minimum threshold p, are stored.

After incrementing the value k of a unit, the probability $P(S_1^k/Y_1^{Nk})$ for the number of symbols Nk (with k>x) is computed at step 506. The pruning performed at step 504 is repeated for this new symbol instant Nk. Steps 504 and 506 are performed for a value k incremented up to the value K. At step 510, once the value K is reached, the marginal a posteriori probabilities $P(S_1^K/Y_1^{NK})$ are known for all possible sequences $s_1^K$. The most likely sequence $s_1^K$ is chosen, i.e. the sequence for which the probability $P(S_1^K/Y_1^{NK})$ is the highest among the possible sequences of the estimation trellis obtained.

When the number of bits N is known, it can constitute a constraint on the termination of the estimation trellis and the paths which do not satisfy the constraint N are not considered.

FIG. 15 depicts the so-called bit-clock sequential estimation method, i.e. based on the source/decoder model. Thus, according to FIG. 10 showing the dependency structure of the source/decoder model, estimation of the sequence of states (X,K) to obtain a stream of bits is equivalent to estimation of the sequence of transitions between these states, i.e. estimation of the sequence S given the observations Y at the channel output. This is represented by a mathematical formulation presented in (13) where α denotes a normalization factor. In the case of optimal arithmetic encoding (for a high value of T), as the bits emitted being distributed uniformly and independently, this normalization factor is $P(U_1^n)/P(Y_1^n)=1$.

At step 600, the probability of decoding a sequence of $K_n$ symbols knowing the bits of the flow of second binary elements $P(S_1^{Kn}/Y_1^n)$ for each bit n (defined later) can be computed in a single forward sweep using the decomposition of equation (13) where $K_n$ is the total number of symbols decoded on reception of a bit n in the state $X_n$. Taking into account the binary source model which defines in (2) the probabilities of transition between states $(X_n,K_n)$ and $(X_{n+1},K_{n+1})$, the probability $P(S_1^{Kn})$ of obtaining a symbol sequence $S_1^{Kn}$ is expressed in a recurrent manner according to equation (14) using equation (15). Considering a memoryless channel, i.e. the probability of observing the second binary elements corresponding to a state of the model only depends on the first binary elements transmitted for this state, the probability $P(Y_1^n/U_1^n)$ can be rewritten and used to obtain the probability $P(S_1^{Kn}/Y_1^n)$ as indicated in (16).

As in the case of FIG. 14, computation of the probability $P(S_1^{Kn}/Y_1^n)$ by equation (16) is initialized for n=1, $S_1=s_1$ taking two possible values 0 or 1 in the case of a binary source, and M possible values in the case of an M-ary source. $C_1$ is the initial state of the source model. Based on this initialisation, equation (16) is used to calculate $P(S_1^k/Y_1^{Nk})$ for each consecutive bit instant n.

All possible sequences of symbols being considered, the size of the estimation trellis increases exponentially with the number of symbols K to be estimated. Thus, step 602 facilitates computation of the probabilities $P(S_1^{Kn}/Y_1^N)$ at step 600 for a number of bits N ranging from 1 to x2, x2 being an integer denoting a threshold number of bits. For the bits from this value x2 upwards, pruning is carried out at step 604 to maintain the complexity of the estimation trellis at a desired level.

Pruning at step 604 can include different implementations corresponding to the implementations of step 504 in FIG. 14. The implementations can be combined or employed separately.

Thus, in a first implementation of the pruning operation at step 604, only the W most likely nodes of a state $(X_n, K_n)$ are retained starting from a number n=x2 to ensure that the computed probabilities (termed likelihoods) are significant. Thus, for each state $(X_n,K_n)$, only the W highest probabilities among the computed probabilities of decoding a sequence of $K_n$ symbols knowing bits of the flow of second binary elements $P(S_1^k/Y_1^{Nk})$ are stored.

In a variant, it is possible to retain only the w most likely nodes for each possible value of $K_n$ (corresponding to the bit-clock). $K_n$ is the number of symbols emitted for n bits received during decoding. The relationship between W and w is given in (20) with $K_{nmax}$ and $K_{nmin}$ depending respectively on the probability of the most and least likely sequence $S_1^k$.

In a second implementation of pruning at step 604, the pruning criterion is based on a threshold applied to the likelihood of the paths. The likelihood of a path is given by equation (13) (bit-clock). In this equation, the terms P(Y|U) are linked to the channel model as indicated in equation (16). As proposed for FIG. 13, pruning involves suppressing all paths for which the mean probability of binary error at the channel output is greater than p. Thus, at each bit instant n, the pruning criterion includes a threshold p compared to the probabilities $P(Y_n|U_n)$ so that all paths on the estimation trellis for which $P(Y_n|U_n)<(1-p)^n$ is verified are suppressed. Only the probabilities of decoding a next symbol knowing bits of the flow of second binary elements $P(S_1^{Kn}/Y_1^n)$, computed from the probabilities $P(Y_n|U_n)$ higher than the minimum threshold p, are stored. Thus, at each bit instant $n_s$ all the paths on the estimation trellis for which the pruning criterion $P(Y_n|U_n)<(1-p)^n$ is satisfied are suppressed.

After incrementing the value n of a unit, the probability $P(S_1^{Kn}/Y_1^n)$ for the number of bits n (with n>x2) is computed at step 606. The pruning performed at step 604 is repeated for this new bit instant $K_n$. Steps 604 and 606 are performed for a value n incremented up to the value N. At step 610, once the value N is reached, the most likely sequence $S_1^N$ is chosen, i.e. the sequence for which the probability $P(S_1^K/Y_1^N)$ is the highest among the possible sequences of the estimation trellis obtained.

At the end of the estimation, the marginal a posteriori probabilities $P(S_1^K/Y_1^N)$ are known for all the sequences $s_1^K$ remaining after pruning.

The termination constraints mentioned can be regarded as a means to force synchronization at the end of the sequence of symbols. In effect, they constrain the decoder to obtain the correct correspondence between the number of symbols decoded and the number of bits observed. However, these constraints do not have the effect of ensuring synchronization in the middle of the sequence.

The addition of extra information to the symbol sequence can facilitate re-synchronization over the whole of the sequence. Thus, extra symbols, or markers, are introduced at known positions in the symbol sequence. The choice of these symbols is arbitrary and is based on the principle of the techniques described in (2, 4, 11, 5, 14). By way of example only, one of the symbols in the alphabet can be chosen or the last coded symbol can be repeated. These markers are inserted at known symbol-clock positions. Consequently, the position of the corresponding extra bits in the binary stream depends on the sequence of symbols encoded, and is random.

Clearly, the methods described above have to take account of this extra information. This knowledge can be exploited by the estimation processes. The variable $K_n$ (k symbol-clock) indicates when a marker is expected. The corresponding transition probabilities in the estimation trellis are updated accordingly. A null probability is assigned to all transitions that do not emit the expected markers, while a probability of 1 is assigned to the others. Therefore, certain paths in the trellis can be suppressed, which leads to a reduction in the number of states and an improved re-synchronization ability.

Examples of robust decoding methods are described above by way of illustration. Other variants can be envisaged. Furthermore, other pruning criteria can be proposed and combined with the methods of the invention. M-ary/binary conversion is not indispensable, but enables small values of T to be used. The decoding methods presented above for binary sources can also work for M-ary sources.

As set forth in the above description, the invention proposes a robust method for decoding arithmetic codes based on the use of arithmetic type codes including reduced-precision arithmetic codes, referred to as quasi-arithmetic codes. The precision of these quasi-arithmetic codes is an adjustable parameter depending on the effect sought. Very high precision makes it possible to achieve compression performances identical to those of arithmetic codes. Lower precision has the effect of increasing robustness at the cost of a reasonable loss in compression.

Compared with conventional "instantaneous" decoding, the invention substantially reduces the phenomenon of desynchronisation of the decoder. Compared with other conventional methods of "sequential" decoding or using tree structures, the invention offers greater flexibility in controlling the tradeoff between compression efficiency, robustness and complexity of decoding. In effect, the invention comprises a set of methods that can be selected depending on the complexity permitted by the terminal, according to the error rate observed on the channel. A sequential decoding method includes a synchronization mechanism coupled with a pruning technique that makes it possible to control the complexity of the decoding process. A trellis-based decoding process with parametrization of the complexity/robustness/compression tradeoff enables the process to be used in conjunction with a channel decoder (convolutive code decoder), which is difficult to achieve with conventional sequential processes.

In the proposed invention, it is to be understood that the described elements of a mathematical nature are of no interest in themselves, but only to the extent that they relate to a flow of information (for example audio or video signals) subjected to hardware constraints.

Appendix 1

$$P(C_{k+1}|C_k) = P(S_{k+1}|C_k) \qquad (1)$$

$$\prod_{k=K_n+1}^{K_{n+1}} P(S_k|C_{k-1}) \qquad (2)$$

$$\hat{X} = \underset{x}{\operatorname{argmax}} P(X = x|Y). \qquad (3)$$

$$P(X, K|Y) = \prod_{n=1}^{N} P(X_n, K_n|Y). \qquad (4)$$

-continued $$P(X_n, K_n | Y) = \frac{P(X_n, K_n | Y_1^n) \cdot P(Y_{n+1}^N | X_n, K_n)}{P(Y_{n+1}^N)} \propto P(X_n, K_n | Y_1^n) \cdot P(Y_{n+1}^N | X_n, K_n), \quad (5)$$

$$P(X_n = x_n, K_n = k_n | Y_1^n) = \sum_{(x_{n-1}, k_{n-1})} P(X_{n-1} = x_{n-1}, K_{n-1} = k_{n-1} | Y_1^{n-1}) \cdot \quad (6)$$
$$P(X_n = x_n, K_n = k_n | X_{n-1} = x_{n-1}, K_{n-1} = k_{n-1}) \cdot$$
$$P(U_n = u_{(x_{n-1}, k_{n-1})(x_n, k_n)} | Y_n).$$

$$P(Y_{n+1}^N | X_n = x_n, K_n = k_n) = \sum_{(x_{n+1}, k_{n+1})} P(Y_{n+2}^N | X_{n+1} = x_{n+1}, K_{n+1} = k_{n+1}) \cdot \quad (7)$$
$$P(X_{n+1} = x_{n+1}, K_{n+1} = k_{n+1} | X_n = x_n, K_n = k_n) \cdot$$
$$P(U_{n+1} = u_{(x_n, k_n)(x_{n+1}, k_{n+1})} | Y_{n+1}).$$

$$P(S_1^K | Y_1^N) = P(S_1^K) \cdot P(U_1^N | Y_1^N) \quad (8)$$
$$\propto P(S_1^K) \cdot P(Y_1^N | U_1^N),$$

$$P\left(S_1^k | Y_1^{N_k}\right) \propto P\left(S_1^{k-1} | Y_1^{N_k-1}\right) \cdot P(S_k | S_{k-1}) \cdot \quad (9)$$
$$P\left(Y_{N_{k-1}+1}^{N_k} | Y_1^{N_k-1}, U_1^{N_k}\right),$$

$$P\left(S_1^k | Y_1^{N_k}\right) \propto P\left(S_1^{k-1} | Y_1^{N_k-1}\right) \cdot P(S_k | C_{k-1}) \cdot \quad (10)$$
$$P\left(Y_{N_{k-1}+1}^{N_k} | U_{N_{k-1}+1}^{N_k}\right)$$

$$P\left(S_1 = s_1 | Y_1^{N_1 = n_1} = y_1^{N_1 = n_1}\right) \propto P(S_1 = s_1 | C_1) \cdot P\left(Y_1^{n_1} = y_1^{n_1} | U_1^{N_1} = u_1^{n_1}\right), \quad (11)$$

$$P\left(Y_{N_{k-1}+1}^{N_k} = y_{n_{k-1}+1}^{n_k} | U_{N_{k-1}+1}^{N_k} = u_{n_{k-1}+1}^{n_k}\right) = \quad (12)$$
$$\left| \prod_{\substack{n=N_{k-1}+1 \\ 1 \text{ else}}}^{N_k} P(Y_n = y_n | U_n = u_n) \text{ if } N_k > N_{k-1} \right.$$

$$P\left(S_1^{K_n} | Y_1^n\right) \propto P\left(S_1^{K_n}\right) \cdot P(Y_1^n | U_1^n) \quad (13)$$

$$P\left(S_1^{K_n}\right) = P\left(S_1^{K_{n-1}}\right) \cdot P\left(S_{K_{n-1}+1}^{K_n} | S_1^{K_{n-1}}\right). \quad (14)$$

$$P\left(S_{K_{n-1}+1}^{K_n} | S_1^{K_{n-1}}\right) = \left| \prod_{\substack{k=K_{n-1}+1 \\ 1 \text{ else}}}^{K_n} P(S_k | C_{k-1}) \text{ si } K_n > K_{n-1} \right. \quad (15)$$

$$P\left(S_1^{K_n} | Y_1^n\right) \propto P\left(S_1^{K_{n-1}}\right) \cdot P(Y_1^{n-1} | U_1^{n-1}) \cdot \quad (16)$$
$$P(Y_n | U_n) \cdot \prod_{k=K_{n-1}+1}^{K_n} P(S_k | C_{k-1})$$
$$\propto P\left(S_1^{K_{n-1}} | Y_1^{n-1}\right) \cdot P(Y_n | U_n) \cdot \prod_{k=K_{n-1}+1}^{K_n} P(S_k | C_{k-1})$$

$$P(X_n = x_n, K_n = k_n | X_{n-1} = x_{n-1}, K_{n-1} = k_{n-1}) = \prod_{k=K_{n-1}+1}^{K_n} P(S_k | C_{k-1}) \quad (17)$$

$$P(Y_n | U_n) < (1-p)^n \quad (18)$$

$$W = (N_{k\max} - N_{k\min} + 1)\omega \quad (19)$$

$$W = (K_{n\max} - K_{n\min} + 1)\omega \quad (20)$$

$$P(Y_i = 0 | U_i = 0) = 1 - p \quad (21)$$
$$P(Y_i = 1 | U_i = 0) = p$$
$$P(Y_i = 0 | U_i = 1) = p$$
$$P(Y_i = 1 | U_i = 1) = 1 - p$$

The invention claimed is:

1. A decoding method embodied in a computer readable medium and executable by a computer, including the following steps:
   a. define a source model
      designed to define probabilities for x-ary symbols ($S_k$) associated with transitions between source states ($C_k$) in a source state diagram,
      a so-called "product" model,
      designed to define a correspondence between the x-ary symbols and first binary elements,
      in relation to product states in a "product" state diagram, a product state being a function of a source state,
   b. receive "channel" properties
      designed to define probabilities of receiving second binary elements, upon transmission of first binary elements,
   c. for a received coded flow of second binary elements, calculate the probabilities of decoding x-ary symbols, knowing bits of the flow of second binary elements, or the probabilities of arriving at product states knowing bits of the flow of second binary elements, from the channel properties of the source model and of the product model,
   d. reconstitute the most probable flow of x-ary symbols from the probabilities computed at step c.

2. A decoding method embodied in a computer readable medium and executable by a computer according to claim 1, characterized in that the product model is defined on the basis of the source model and a transfer model designed to establish a correspondence between x-ary symbols and first binary elements in relation to probabilities associated with x-ary symbols.

3. A decoding method embodied in a computer readable medium and executable by a computer according to claim 2, characterized in that the source model includes transitions associated with a correspondence between source m-ary symbols ($A_k$) and target x-ary symbols ($S_k$), in particular $m \geq x$ and $x=2$.

4. A decoding method embodied in a computer readable medium and executable by a computer according to claim 1, characterized in that the product and transfer models are of the arithmetic type and in that the transfer model is an encoding or decoding model.

5. A decoding method embodied in a computer readable medium and executable by a computer according to claim 1, characterized in that step c. includes the computation, in steps, of the probabilities of decoding an x-ary symbol knowing bits of the flow of second binary elements.

6. A decoding method embodied in a computer readable medium and executable by a computer according to claim 5, characterized in that step c. includes the construction of a tree composed of states linked by transitions, each state corresponding to a step in the calculation of probabilities and each transition, starting from a state, corresponding to one of these computed probabilities.

7. A decoding method embodied in a computer readable medium and executable by a computer according to claim 5, characterized in that step c. includes the computation, for a given number of successive x-ary symbols to be decoded, of probabilities of decoding a sequence of x-ary symbols knowing bits of the flow of second binary elements.

8. A decoding method embodied in a computer readable medium and executable by a computer according to claim 5, characterized in that step c. includes the computation, for a given number of successive bits in the flow of second binary elements, of probabilities of decoding a sequence of x-ary symbols knowing bits of the flow of second binary elements.

9. A decoding method embodied in a computer readable medium and executable by a computer according to claim 1, characterized in that step c. includes, for each step from a given number of steps and based on a given selection criterion, the selection of certain probabilities among the probabilities of decoding an x-ary symbol computed during a step, knowing bits of the flow of second binary elements.

10. A decoding method embodied in a computer readable medium and executable by a computer according to claim 9, characterized in that the selection criterion at step c. includes a fixed number of probabilities to be retained among the highest of the probabilities.

11. A decoding method embodied in a computer readable medium and executable by a computer according to claim 9, characterized in that the selection criterion at step c. includes a minimum threshold compared to the probabilities of receiving second binary elements, upon transmitting first binary elements, so as to store at each step only the probabilities of decoding an x-ary symbol, knowing bits of the flow of second binary elements, computed from the probabilities of receiving second binary elements, upon transmitting first binary elements, higher than this minimum threshold.

12. A decoding method embodied in a computer readable medium and executable by a computer according to claim 1, characterized in that step d. includes computation of the product of the probabilities corresponding to successive transitions in the tree and selection of the largest product corresponding to the most probable successive transitions and the most probable flow of x-ary symbols.

13. A decoding method embodied in a computer readable medium and executable by a computer according to claim 1, characterized in that, based on the product model establishing said correspondence, step c. includes
   c1. successive construction of states linked by transitions in a product states diagram from an initial state to a final state, each state defining an expected number of decoded x-ary symbols for a given number of bits in the flow of second binary elements from the initial state.

14. A decoding method embodied in a computer readable medium and executable by a computer according to claim 13, characterized in that the construction of step c. includes
   c2. the successive suppression of states from the product states diagram, from the final state to the initial state, for which the expected number of x-ary symbols for a given number of bits in the flow of second binary elements is different from a known maximum number of x-ary symbols.

15. A decoding method embodied in a computer readable medium and executable by a computer according to claim 13, characterized in that step c. includes
   c3. the computation, after constructing each state, of the first successive probabilities of arriving at a given state knowing past bits in the flow of second binary elements,
   c4. the computation, for each state from the final state to the initial state, of second successive probabilities of observing next bits in the flow of second binary elements knowing this given state.

16. A decoding method embodied in a computer readable medium and executable by a computer according to claim 13, characterized in that step c. includes
   c5. the computation, for each state of the diagram from the initial state to the final state, of first successive probabilities of arriving at this state knowing past bits in the flow of second binary elements and, for each state from the final state to the initial state, of second successive probabilities of observing next bits in the flow of second binary elements knowing a given state.

17. A decoding method embodied in a computer readable medium and executable by a computer according to claim 13, characterized in that step c. includes computation of the probability of arriving at this given state knowing the bits of the flow of second binary elements by determining the product of the first and second probabilities for each state.

18. A decoding method embodied in a computer readable medium and executable by a computer according to claim 1, characterized in that step d. includes computation of the products of probabilities of different possible successive states followed by selection of the maximum product.

19. A decoding method embodied in a computer readable medium and executable by a computer according to claim 13, characterized in that step d. includes the establishment of the flow of x-ary symbols corresponding to these successive states using the correspondence of the product model.

20. A decoder including
a first input to receive an encoded flow of second binary elements, characterized in that it includes
a second input to receive channel properties designed to define probabilities of receiving second binary elements, upon transmitting first binary elements,
a first module, having executable computer code for defining
a source model designed to define probabilities for x-ary symbols associated with transitions between source states in a source state diagram,
a so-called "product" model designed to define a correspondence between the x-ary symbols and first binary elements,
in relation to product states in a "product" state diagram, a product state being a function of a source state,
a processing module, having executable computer code adapted to calculate probabilities of decoding x-ary symbols,
knowing bits of the encoded flow of second binary elements, based on channel properties, of the source model and the product model, or probabilities of arriving at product states knowing bits of the flow of second binary elements,
and adapted to reconstitute the most probable flow of x-ary symbols from these computed probabilities.

* * * * *